US011200962B2

(12) United States Patent
Lee et al.

(10) Patent No.: US 11,200,962 B2
(45) Date of Patent: *Dec. 14, 2021

(54) MEMORY DEVICES HAVING SPARE COLUMN REMAP STORAGES AND METHODS OF REMAPPING COLUMN ADDRESSES IN THE MEMORY DEVICES

(71) Applicant: SK hynix Inc., Icheon-si (KR)

(72) Inventors: Hokyoon Lee, Icheon-si (KR); Il Park, Yongin-si (KR); Young Pyo Joo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/903,065

(22) Filed: Jun. 16, 2020

(65) Prior Publication Data

US 2020/0312423 A1    Oct. 1, 2020

Related U.S. Application Data

(63) Continuation of application No. 16/012,335, filed on Jun. 19, 2018, now Pat. No. 10,726,939.

(30) Foreign Application Priority Data

Sep. 27, 2017    (KR) .................. 10-2017-0125511
Sep. 27, 2017    (KR) .................. 10-2017-0125512

(51) Int. Cl.
*G11C 29/00*    (2006.01)
*G11C 29/24*    (2006.01)
*G11C 29/44*    (2006.01)

(52) U.S. Cl.
CPC .............. *G11C 29/70* (2013.01); *G11C 29/24* (2013.01); *G11C 29/4401* (2013.01); *G11C 29/76* (2013.01); *G11C 29/808* (2013.01); *G11C 29/81* (2013.01); *G11C 29/814* (2013.01)

(58) Field of Classification Search
CPC ..... G11C 29/70; G11C 29/24; G11C 29/4401; G11C 29/76; G11C 29/808; G11C 29/81; G11C 29/814
USPC ......................................... 365/201
See application file for complete search history.

(56) References Cited

U.S. PATENT DOCUMENTS

| 5,495,447 | A | * | 2/1996 | Butler ................. G11C 8/12 365/200 |
| 5,657,439 | A |  | 8/1997 | Jones et al. |
| 6,055,204 | A |  | 4/2000 | Bosshart |
| 7,043,672 | B2 | * | 5/2006 | Merritt ............... G11C 29/70 714/711 |
| 9,805,828 | B1 | * | 10/2017 | Yoko ................. G11C 29/78 |

(Continued)

*Primary Examiner* — Sung Il Cho
(74) *Attorney, Agent, or Firm* — William Park & Associates Ltd.

(57) ABSTRACT

A memory device includes a data storage region and a spare column remap storage. The data storage region includes a plurality of sub-arrays, and each of the plurality of sub-arrays has a plurality of main columns and a plurality of spare columns. The spare column remap storage includes a plurality of storage units storing column address information of a repaired main column of one of the plurality of sub-arrays and address information of a repaired main column of another of the plurality of sub-arrays into at least one of the plurality of storage units included in the spare column remap storage.

25 Claims, 31 Drawing Sheets

(56) References Cited

U.S. PATENT DOCUMENTS

| | | | |
|---|---|---|---|
| 2004/0019763 A1* | 1/2004 | Lakhani | G11C 29/76 |
| | | | 711/206 |
| 2007/0030742 A1* | 2/2007 | Lunde | G11C 29/81 |
| | | | 365/200 |
| 2007/0103978 A1* | 5/2007 | Conley | G11C 16/0483 |
| | | | 365/185.09 |
| 2008/0091988 A1* | 4/2008 | Yoel | G11B 20/1883 |
| | | | 714/711 |
| 2008/0266990 A1* | 10/2008 | Loeffler | G11C 29/808 |
| | | | 365/201 |
| 2009/0055621 A1* | 2/2009 | Nakanishi | G11C 29/804 |
| | | | 711/202 |
| 2009/0168569 A1* | 7/2009 | Ryu | G11C 29/808 |
| | | | 365/200 |
| 2011/0002169 A1* | 1/2011 | Li | G11C 29/808 |
| | | | 365/185.09 |
| 2012/0266016 A1* | 10/2012 | Huang | G11C 29/808 |
| | | | 714/6.13 |
| 2014/0289574 A1* | 9/2014 | Tsern | G11C 29/50016 |
| | | | 714/718 |
| 2015/0135038 A1* | 5/2015 | Wilson | G11C 29/76 |
| | | | 714/773 |
| 2015/0227461 A1* | 8/2015 | Benedict | G11C 29/70 |
| | | | 711/210 |
| 2015/0287480 A1* | 10/2015 | Wilson | G11C 17/16 |
| | | | 365/96 |
| 2017/0062067 A1* | 3/2017 | Yang | G11C 16/10 |

* cited by examiner

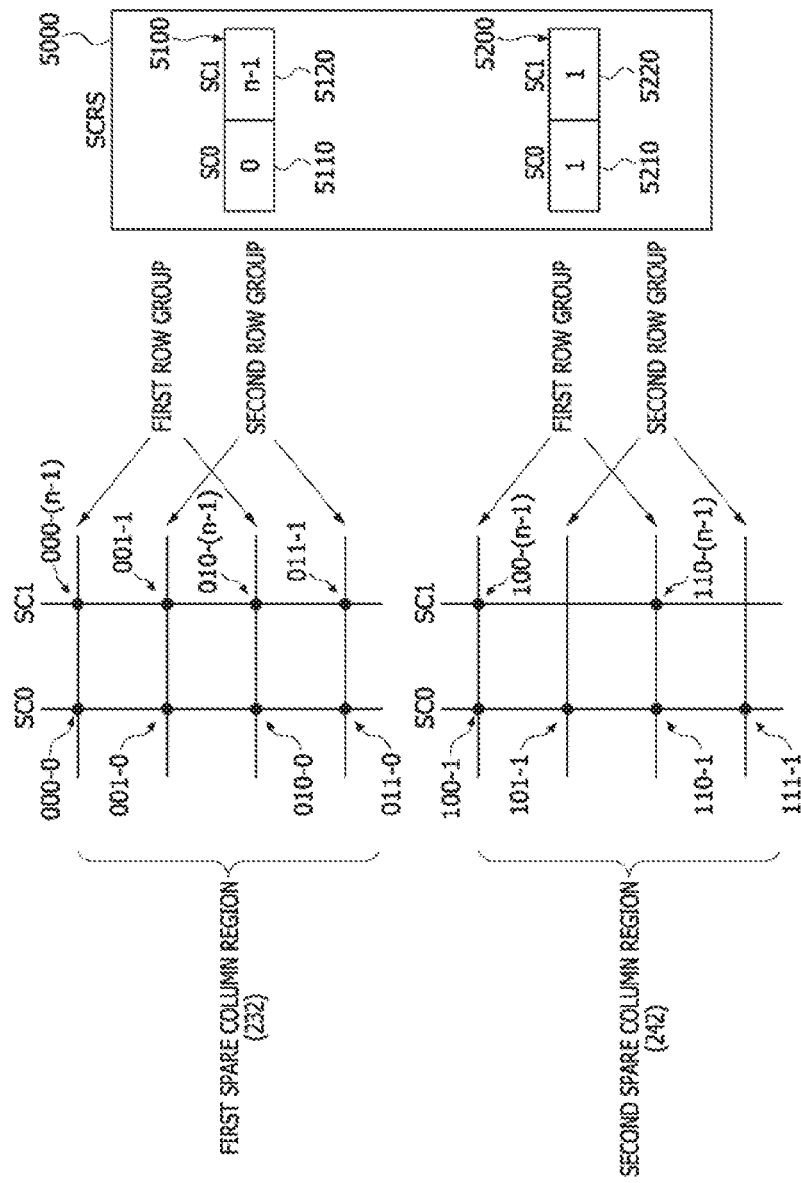

MEMORY DEVICES HAVING SPARE COLUMN REMAP STORAGES AND METHODS OF REMAPPING COLUMN ADDRESSES IN THE MEMORY DEVICES

CROSS-REFERENCE TO RELATED APPLICATIONS

This application is a continuation application of U.S. patent application Ser. No. 16/012,335 filed on Jun. 19, 2018, which claims priority under 35 U.S.C 119(a) to Korean Application Nos. 10-2017-0125511 and 10-2017-0125512, filed on Sep. 27, 2017, which are herein incorporated by reference in its entirety.

BACKGROUND

1. Technical Field

Various embodiments of the present disclosure generally relate to memory devices and, more particularly, to memory devices having spare column remap storage and methods of remapping column addresses in the memory devices.

2. Description of the Related Art

As memory devices become more highly integrated to increase a data storage capacity, the reliability of electronic systems including the memory devices tends to depend on the reliability of the memory devices. The memory devices may be designed to repair failed memory cells using a built-in-self-repair (BISR) scheme with a redundancy circuit in order to increase the fabrication yield of the memory devices and in order to guarantee the reliability of the memory devices. According to the BISR scheme, core columns including failed memory cells may be replaced by spare columns for repairing the failed memory cells. However, in such a case, there may be a limitation in repairing the failed memory cells. That is, it may be difficult to repair all the failed memory cells if the number of spare columns is less than the number of the core columns including the failed memory cells.

SUMMARY

According to an embodiment, a memory device includes a data storage region and a spare column remap storage. The data storage region includes a plurality of sub-arrays, and each of the plurality of sub-arrays has a plurality of main columns and a plurality of spare columns. The spare column remap storage includes a plurality of storage units storing column address information of a repaired main column of one of the plurality of sub-arrays and address information of a repaired main column of another of the plurality of sub-arrays into at least one of the plurality of storage units included in the spare column remap storage.

According to other embodiment, there is provided a method of remapping column addresses of a memory device. The memory device includes a data storage region and a spare column remap storage. The data storage region includes a plurality of sub-arrays, and each of the plurality of sub-arrays includes a plurality of main columns and a plurality of spare columns. The spare column remap storage includes a plurality of storage units. The method includes storing address information of a repaired main column of one of the plurality of sub-arrays and address information of a repaired main column of another of the plurality of sub-arrays into at least one of the plurality of storage units included in the spare column remap storage.

According to another embodiment, there is provided a method of remapping addresses of a memory device which includes a data storage region and a spare column remap storage. The data storage region includes a plurality of sub-arrays, and each of the plurality of sub-arrays includes a plurality of main columns and a plurality of spare columns. The spare column remap storage includes a plurality of storage units. The method includes storing column address information of one main column repaired in units of columns among the plurality of main columns and column address information of another main column repaired in units of row groups among the plurality of main columns into at least one of the plurality of storage units.

BRIEF DESCRIPTION OF THE DRAWINGS

Various embodiments of the present disclosure will become more apparent in view of the attached drawings and accompanying detailed description, in which:

FIG. 31 is a schematic view illustrating a first spare column region and a second spare column region together with a spare column remap storage, which are repaired in units of columns and in units of row groups according the embodiment described with reference to FIGS. 24 to 30.

DETAILED DESCRIPTION OF THE EMBODIMENTS

In the following description of the embodiments, it will be understood that the terms "first" and "second" are intended to identify an element, but not used to define only the element itself or to mean a particular sequence. In addition, when an element is referred to as being located "on", "over", "above", "under", or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below", and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Various embodiments are directed to memory devices having spare column remap storage and methods of remapping column addresses in the memory devices.

Figure 1:
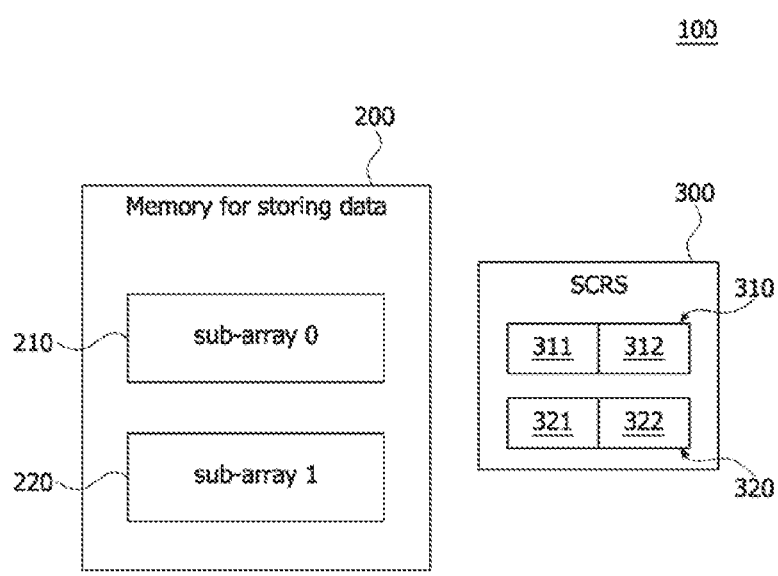
FIG. 1 is a block diagram illustrating a memory device according to an embodiment of the present disclosure.

FIG. 1 is a block diagram illustrating a memory device 100 according to an embodiment of the present disclosure. Referring to FIG. 1, the memory device 100 may be configured to include a data storage region 200 (corresponding to memory for storing data) and a spare column remap storage (SCRS) 300. The data storage region 200 may correspond to a region in which data is actually stored. The SCRS 300 may correspond to a region for storing information of column addresses which are remapped while failed memory cells in the data storage region 200 are repaired. The data storage region 200 may include a first sub-array (denoted by 'sub-array 0') 210 and a second sub-array (denoted by 'sub-array 1') 220. Although FIG. 1 illustrates an example in which the data storage region 200 includes two sub-arrays, the present disclosure is not limited thereto. For example, in some other embodiments, the data storage region 200 may include three or more sub-arrays. In an embodiment, the first and second sub-arrays 210 and 220 may be distinguished from each other by physical addresses. In an embodiment, every unit cell in the first sub-array 210 may be denoted by a physical address that includes a first bit (corresponding to a most significant bit (MSB)) having a binary number of '0', and every unit cell in the second sub-array 220 may be denoted by a physical address that includes a first bit (i.e., an MSB) having a binary number of '1'.

The SCRS 300 may include a first storage unit 310 and a second storage unit 320. The number of storage units constituting the SCRS 300 may be equal to the number of sub-arrays included in the data storage region 200. That is, if the number of sub-arrays included in the data storage region 200 is two, the SCRS 300 may be configured to include two storage units. The first storage unit 310 may include a first virtual address storage element 311 and a second virtual address storage element 312. The second storage unit 320 may also include a first virtual address storage element 321 and a second virtual address storage element 322. That is, each of the first and second storage units 310 and 320 in the SCRS 300 may include a plurality of virtual address storage elements. The number of virtual address storage elements included in each of the first and second storage units 310 and 320 may be determined according to a configuration of the data storage region 200 and will be described more fully in the following embodiments.

Figure 2:
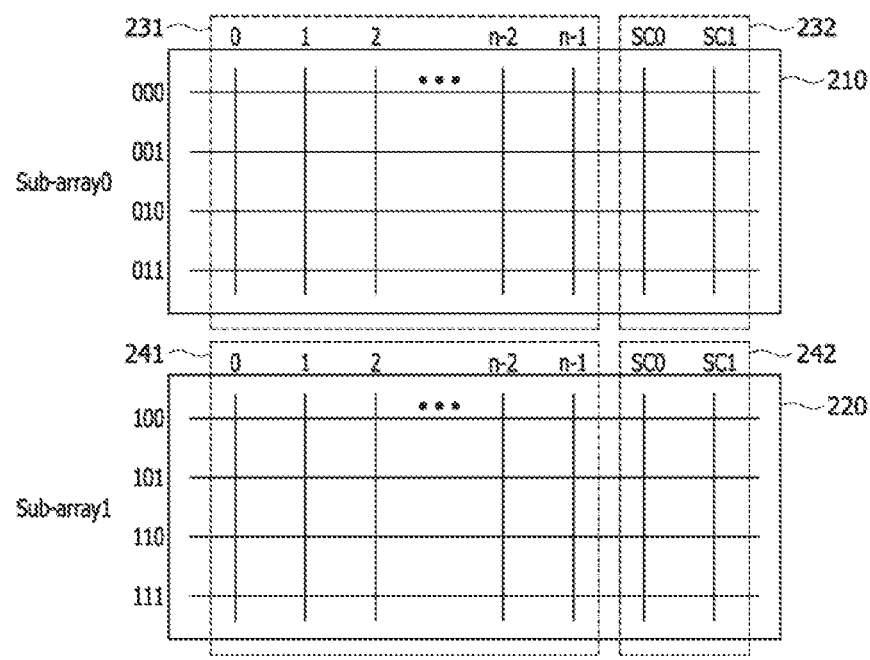
FIG. 2 is a schematic view illustrating a first sub-array and a second sub-array constituting a memory for storing data in the memory device shown in FIG. 1.

FIG. 2 is a schematic view illustrating the first sub-array 210 and the second sub-array 220 included in the data storage region 200 of the memory device 100 shown in FIG. 1. Referring to FIG. 2, each of the first sub-array 210 and the second sub-array 220 may include a plurality of unit cells which are respectively located at cross points or intersection points where a plurality of rows and a plurality of columns cross or intersect. In an embodiment, the first and second sub-arrays 210 and 220 may have the same number of unit cells and may have the same cell array configuration. In the present embodiment, the first sub-array 210 may have first to fourth rows in which the unit cells are arrayed. Similarly, the second sub-array 220 may have first to fourth rows in which the unit cells are arrayed. However, FIG. 2 illustrates merely an example of the data storage region 200. In some other embodiments, each of the first and second sub-arrays 210 and 220 may have five or more rows in which the unit cells are arrayed.

The unit cells arrayed in any one of the plurality of rows may have the same row address in common. The plurality of rows in the first and second sub-arrays 210 and 220 may have different row addresses which are distinguished from each other. In an embodiment, the unit cells arrayed in the first row of the first sub-array 210 may have a row address of '000' in common, the unit cells arrayed in the second row of the first sub-array 210 may have a row address of '001' in common, the unit cells arrayed in the third row of the first sub-array 210 may have a row address of '010' in common, and the unit cells arrayed in the fourth row of the first sub-array 210 may have a row address of '011' in common. As described above, the first bits (i.e., MSBs) of the row addresses of the unit cells in the first sub-array 210 may have a binary number of '0' in common, and the first to fourth rows in the first sub-array 210 may be distinguished from each other according to logic level combinations of the second and third bits (i.e., two least significant bits (2 LSBs)) of the row addresses.

Similarly, the unit cells arrayed in the first row of the second sub-array 220 may have a row address of '100' in common, the unit cells arrayed in the second row of the second sub-array 220 may have a row address of '101' in common, the unit cells arrayed in the third row of the second sub-array 220 may have a row address of '110' in common, and the unit cells arrayed in the fourth row of the second sub-array 220 may have a row address of '111' in common. As described above, the first bits (i.e., MSBs) of the row addresses of the unit cells in the second sub-array 220 may have a binary number of '1' in common, and the first to fourth rows in the second sub-array 220 may be distinguished from each other according to logic level combinations of the second and third bits of the row addresses.

The first sub-array 210 may include a first main column region 231 and a first spare column region 232. The second sub-array 220 may include a second main column region 241 and a second spare column region 242. Each of the first and second main column regions 231 and 241 may include "N" columns, that is, first to $N^{th}$ main columns, where 'N' denotes a natural number. Each of the first to $N^{th}$ main columns may be denoted by its own column address. The column addresses of the first to $N^{th}$ main columns may be denoted by binary numbers. However, in the present embodiment, the column addresses of the first to $N^{th}$ main columns may be respectively denoted by decimal numbers of '0', '1', '2', . . . , 'n−2' and 'n−1' for the purpose of ease and convenience in explanation. Each of the first and second spare column regions 232 and 242 may include a first spare column SC0 and a second spare column SC1. In some other embodiments, three or more spare columns may be included in each of the first and second spare column regions 232 and 242.

The number of virtual address storage elements in each of the first and second storage units 310 and 320 constituting the SCRS 300 may be determined according to the number of spare columns included in each of the first and second spare column regions 232 and 242. In an embodiment, the number of virtual address storage elements in each of the first and second storage units 310 and 320 may be equal to the number of spare columns included in each of the first and second spare column regions 232 and 242. In other words, each of the virtual address storage elements in each of the first and second storage units 310 and 320 may be equal to the number of spare columns included in each of the sub-arrays 210 and 220. As illustrated in FIG. 2, if each of the first and second sub-arrays 210 and 220 has first and second spare columns SC0 and SC1, each of first and second storage units (310 and 320 of FIG. 1) may include two virtual address storage elements, that is, the first and second virtual address storage elements 311 and 312, or 321 and 322.

Each of the main unit cells in the first sub-array 210 may be selected by one row address and one column address. For example, the main unit cell located at a cross point of the second row and the $(N-2)^{th}$ column in the first sub-array 210 may be selected by a row address of '001' indicating the second row in the first sub-array 210 and a column address of 'n−3' indicating the $(N-2)^{th}$ column. Similarly, each of the main unit cells in the second sub-array 220 may also be selected by one row address and one column address. For example, the main unit cell located at a cross point of the second row and the $(N-2)^{th}$ column in the second sub-array 220 may be selected by a row address of '101' indicating the second row in the first sub-array 210 and a column address of 'n−3' indicating the $(N-2)^{th}$ column.

Figure 3:
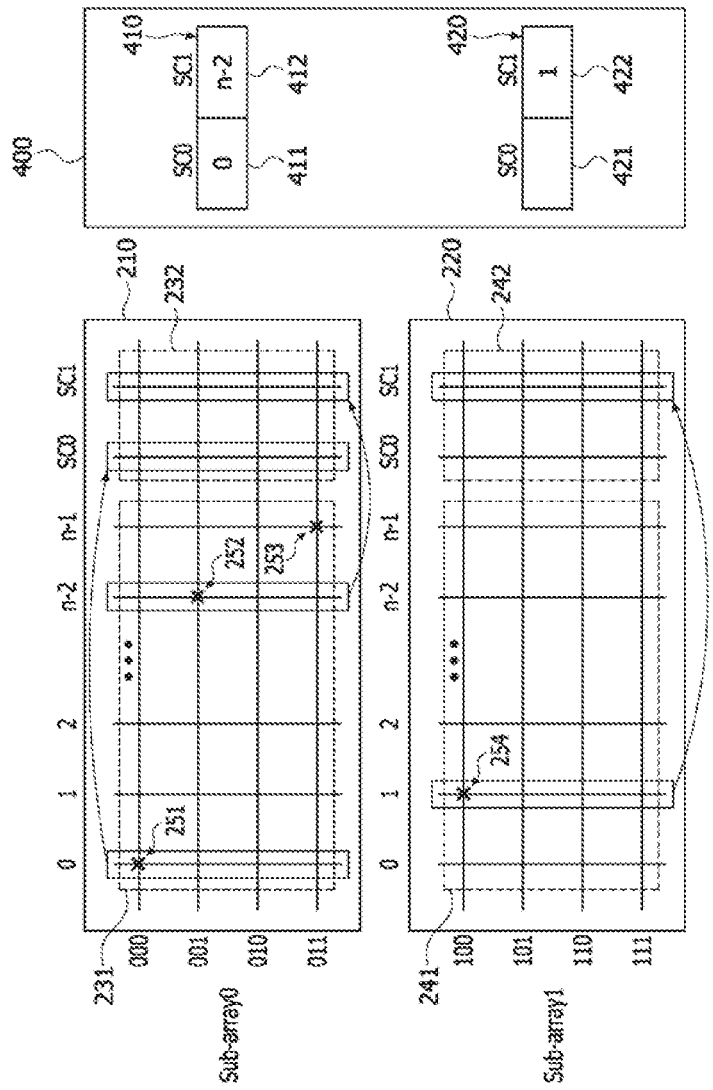
FIG. 3 is a schematic view illustrating a general method of repairing the first and second sub-arrays shown in FIG. 2 and a general method of remapping column addresses of repaired columns in the first and second sub-arrays using a spare column remap storage.

FIG. 3 is a schematic view illustrating a general method of repairing the first and second sub-arrays 210 and 220 shown in FIG. 2 and a general method of remapping column addresses of repaired columns in the first and second sub-arrays 210 and 220 using a spare column remap storage (SCRS) 400. Referring to FIG. 3, the first and second sub-arrays 210 and 220 may have the same configuration as described with reference to FIGS. 1 and 2. The SCRS 400 may include a first storage unit 410 and a second storage unit 420. The first storage unit 410 of the SCRS 400 may be physically allocated to the first sub-array 210, and the second storage unit 420 of the SCRS 400 may be physically allocated to the second sub-array 220. Thus, the first storage unit 410 may store column address information of main columns which are repaired in the first sub-array 210, and the second storage unit 420 may store column address information of main columns which are repaired in the second sub-array 220.

The first storage unit 410 of the SCRS 400 may include a plurality of physical address storage elements (e.g., a first physical address storage element 411 and a second physical address storage element 412), the number of which is equal to the number of spare columns SC0 and SC1 in the first sub-array 210. The first physical address storage element 411 may store column address information of the first main column region 231 of a main column which is replaced by the first spare column SC0 of the first sub-array 210. The second physical address storage element 412 may store column address information of the first main column region 231 of a main column which is replaced by the second spare column SC1 of the first sub-array 210. The second storage unit 420 of the SCRS 400 may include a plurality of physical address storage elements (e.g., a third physical address storage element 421 and a fourth physical address storage element 422), the number of which is equal to the number of spare columns SC0 and SC1 in the second sub-array 220. The third physical address storage element 421 may store column address information of the second main column region 241 of a main column which is replaced by the first spare column SC0 of the second sub-array 220. The fourth physical address storage element 422 may store column address information of the second main column region 241 of a main column which is replaced by the second spare column SC1 of the second sub-array 220.

In order to perform a repair process and an address remapping process relating to the repair process, the main unit cells in the first and second sub-arrays 210 and 220 may be tested to verify whether each of the main unit cells operates normally. The main unit cells in the first and second sub-arrays 210 and 220 may be tested using various test patterns, for example, a checkerboard pattern and a march pattern. In an embodiment, testing the main unit cells in the first and second sub-arrays 210 and 220 may include generating a test pattern and writing data provided by the test pattern into the main unit cells. In addition, data stored in the main unit cells may be read out by a read operation, and data outputted from the main unit cells may be compared with data provided by the test pattern. If the data outputted from the main unit cells is consistent with the data provided by the test pattern, all the main unit cells in the first and second sub-arrays 210 and 220 may be regarded as normal unit cells. In contrast, if datum outputted from a certain one of the main unit cells is inconsistent with the corresponding datum of data provided by the test pattern, the certain main unit cell may be regarded as a failed unit cell (or an abnormal unit cell).

In FIG. 3, it is assumed that the first main column region 231 has three failed unit cells and the second main column region 241 has one failed unit cell. Specifically, as indicated by symbols "x" in FIG. 3, a first failed unit cell 251 may be located at a cross point of the first row and the first main column in the first main column region 231, a second failed unit cell 252 may be located at a cross point of the second row and the $(N-1)^{th}$ main column in the first main column region 231, and a third failed unit cell 253 may be located at a cross point of the fourth row and the $N^{th}$ main column in the first main column region 231. In addition, a fourth failed unit cell 254 corresponding to a single failed unit cell in the second main column region 241 may be located at a cross point of the first row and the second main column in the second main column region 241.

After the distribution of the first to fourth failed unit cells 251, 252, 253, and 254 is obtained by the test result, a repair process may be performed. In general, the repair process may be performed in units of columns using spare columns. If the general repair process is applied to the first and second sub-arrays 210 and 220, the first main column having the first failed unit cell 251 may be replaced by the first spare column SC0 in the first sub-array 210 and the $(N-1)^{th}$ main column having the second failed unit cell 252 may be replaced by the second spare column SC1 in the first sub-array 210. In such a case, the main unit cells arrayed in the first main column of the first sub-array 210 may be respectively replaced by spare unit cells arrayed in the first spare column SC0 of the first sub-array 210, and the main unit cells arrayed in the $(N-1)^{th}$ main column of the first sub-array 210 may be respectively replaced by spare unit cells arrayed in the second spare column SC1 of the first sub-array 210. Thus, because both the first and second spare columns SC0 and SC1 in the first sub-array 210 are used to repair the first and second failed unit cells 251 and 252, it may be impossible to repair the third failed unit cell 253.

A value '0' corresponding to the column address of the first main column replaced by the first spare column SC0 of the first sub-array 210 may be stored in the first physical address storage element 411 of the first storage unit 410 of the SCRS 400. In addition, a value 'n-2' corresponding to the column address of the $(N-1)^{th}$ main column replaced by the second spare column SC1 of the first sub-array 210 may be stored in the second physical address storage element 412 of the first storage unit 410 of the SCRS 400.

Moreover, the second main column having the fourth failed unit cell 254 may be replaced by the first spare column SC0 or the second spare column SC1 in the second sub-array 220. Hereinafter, the general repair process will be described in conjunction with an example in which the second main column having the fourth failed unit cell 254 is replaced by the second spare column SC1 in the second sub-array 220. In such a case, the main unit cells arrayed in the second main column of the second sub-array 220 may be replaced by spare unit cells arrayed in the second spare column SC1 of the second sub-array 220, respectively. Thus, a value corresponding to the column address of the second main column replaced by the second spare column SC1 in the second sub-array 220 may be stored in the second physical address storage element 422 of the second storage unit 420 of the SCRS 400. Because the second sub-array 220 has only one failed unit cell (i.e., the fourth failed unit cell 254), no information is stored in the first physical address storage element 421 of the second storage unit 420 of the SCRS 400.

As described above, if the general repair process and the address remapping process relating to the general repair process are applied to the first sub-array 210 including three main columns having the first to third failed unit cells 251, 252, and 253 and the second sub-array 220 including one main column having the fourth failed unit cell 254, only two of the three main columns having the first to third failed unit cells 251, 252, and 253 may be repaired, and the single main column having the fourth failed unit cell 254 may be repaired. As a result, one of the three main columns having the first to third failed unit cells 251, 252, and 253 cannot be repaired while one of the first and second spare columns SC0 and SC1 in the second sub-array 220 is not utilized in repairing the second sub-array 220. That is, even though the first physical address storage element 421 of the second storage unit 420 of the SCRS 400 is not utilized in repairing the second sub-array 220, a repair process of all failed unit cells of the first and second sub-arrays 210 and 220 may possibly not be successfully performed.

In the column address remapping process relating to the general repair process described with reference to FIG. 3, the first and second storage units 410 and 420 constituting the SCRS 400 may be configured to physically correspond to the first and second sub-arrays 210 and 220, respectively. However, according to various embodiments of the present disclosure, while 1:1 physical relations between storage units in an SCRS and sub-arrays in memory are removed, virtual relations between the storage units in the SCRS and the sub-arrays in memory may be established to virtually allocate remapped column addresses into the storage units of the SCRS according to a distribution of failed unit cells. In particular, at least one of the storage units constituting the SCRS may store address information of main columns repaired in one of the sub-arrays and address information of main columns repaired in another of the sub-arrays. As such, the embodiments of the present disclosure may employ a design scheme for virtually allocating the column addresses of the repaired main columns. Accordingly, even though the number of main columns having failed unit cells in a certain sub-array of the sub-arrays is greater than the number of spare columns in the certain sub-array, all the main columns having failed unit cells in the certain sub-array may be repaired with the spare columns in certain sub-array by utilizing storage elements in at least two storage units of the SCRS. As a result, it may be possible to improve a repair efficiency of the memory device.

Figure 4:
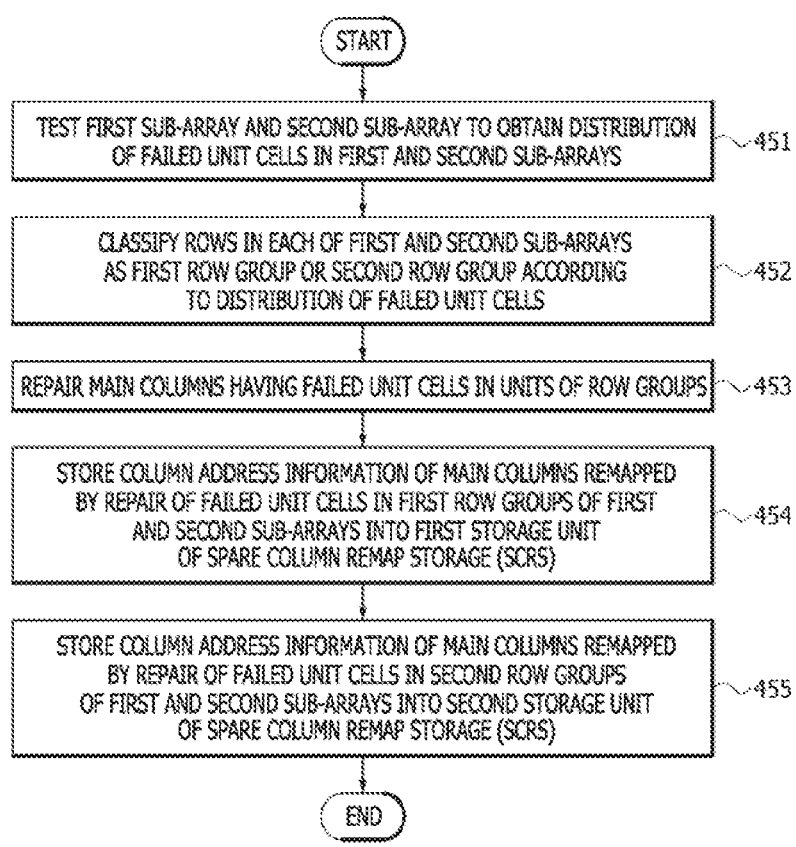
FIG. 4 is a flowchart illustrating a method of remapping to column addresses with a spare column remap storage in a repair process of a memory device according to an embodiment of the present disclosure.

FIG. 4 is a flowchart illustrating a method of remapping column addresses of main unit cells with a spare column remap storage (SCRS) in a repair process of a memory device according to an embodiment of the present disclosure. Referring to FIG. 4, a first sub-array and a second sub-array may be tested to obtain a distribution of failed unit cells in each of the first and second sub-arrays (see a step 451). Rows in the first and second sub-arrays may be classified as a first row group or a second row group according to the distribution of the failed unit cells (see a step 452). Thus, the main unit cells and spare unit cells arrayed in each row of the first and second sub-arrays may belong to the first row group or the second row group. After the rows in each of the first and second sub-arrays are classified as the first row group or the second row group, main columns having failed unit cells may be repaired in units of row groups (see a step 453). After the main columns having failed unit cells are repaired in units of row groups, column addresses of the repaired main columns may be remapped. Specifically, column address information of the main columns remapped by repair of the failed unit cells in the first row groups of the first and second sub-arrays may be stored in a first storage unit of the spare column remap storage (SCRS) (see a step 454). In addition, column address information of the main columns remapped by repair of the failed unit cells in the second row groups of the first and second sub-arrays may be stored in a second storage unit of the spare column remap storage (SCRS) (see a step 455).

FIGS. 5 to 11 are schematic views illustrating in detail a method of remapping column addresses with a spare column remap storage in a repair process of a memory device according to an embodiment of the present disclosure. In FIGS. 5 to 11, the same reference numerals as used in FIGS. 1 and 2 denote the same elements. The present embodiment will be described in conjunction with an example in which the memory device 100 includes the first sub-array 210 and the second sub-array 220. However, the inventive concept of the present embodiment may be equally applicable to any memory device including three or more sub-arrays.

Figure 5:
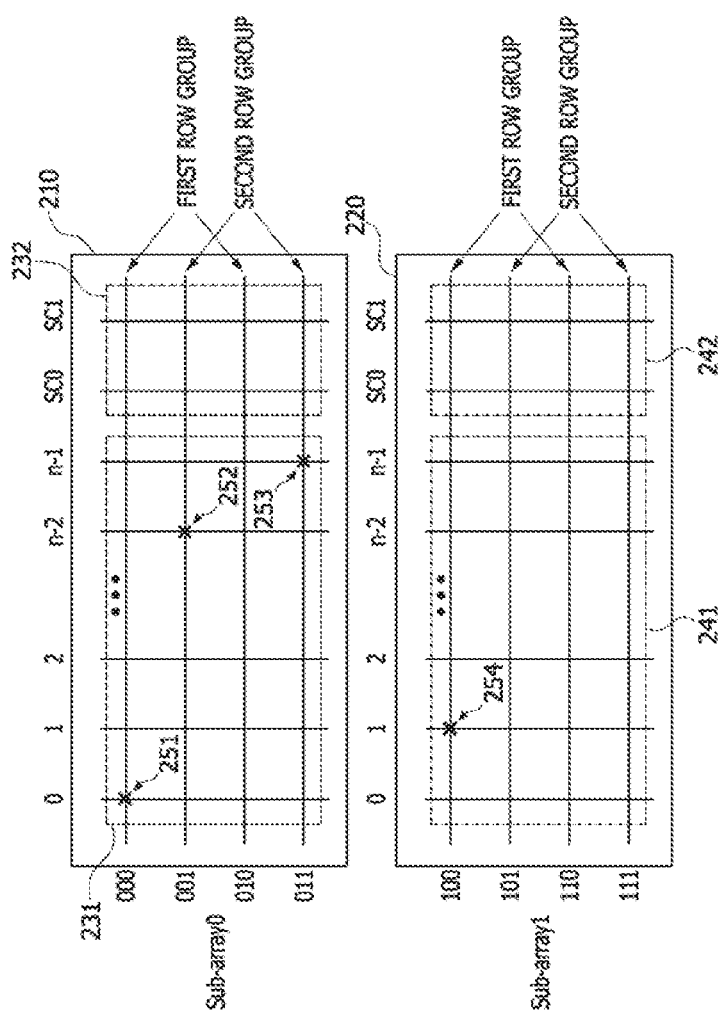
FIGS. 5 to 11 are schematic views illustrating in detail a method of remapping column addresses with a spare column remap storage in a repair process of a memory device according to an embodiment of the present disclosure.

Referring to FIG. 5, the unit cells in the first main column region 231 of the first sub-array 210 and the unit cells in the second main column region 241 of the second sub-array 220 may be tested to obtain a distribution of failed unit cells. The address remapping method according to the present embodiment will be described in conjunction with an example in which a distribution of the failed unit cells obtained by the test of the unit cells in the first and second main column regions 231 and 241 is the same as the distribution illustrated in FIG. 3. Thus, as indicated by symbols "x" in FIG. 5, the first failed unit cell 251 may be located at a cross point of the first row and the first main column in the first main column region 231, the second failed unit cell 252 may be located at a cross point of the second row and the $(N-1)^{th}$ main column in the first main column region 231, and the third faded unit cell 253 may be located at a cross point of the fourth row and the $N^{th}$ main column in the first main column region 231. In addition, the fourth failed unit cell 254 may be located at a cross point of the first row and the second main column in the second main column region 241. The remaining unit cells except the first to fourth failed unit cells 251, 252, 253, and 254 may be regarded as normal unit cells.

After distribution of the failed unit cells is obtained, a repair process and an address remapping process relating to the repair process may be performed. In order to perform the repair process and the address remapping process, rows in the first sub-array 210 may be categorized as either a first row group or a second row group. Similarly, rows in the second sub-array 220 may be categorized as either a first row group or a second row group. The rows in the first and second sub-arrays 210 and 220 may be classified as a first row group or a second row group according to the number of failed unit cells included in each of the rows. For example, the rows in the first and second sub-arrays 210 and 220 may be classified as a first row group or a second row group so that the number of failed unit cells in the first row groups of the first and second sub-arrays 210 and 220 is less than or equal to the number of spare columns in any one of the first and second sub-arrays 210 and 220, and the number of failed unit cells in the second row groups of the first and second sub-arrays 210 and 220 is less than or equal to the number of spare columns in any one of the first and second sub-arrays 210 and 220.

Classifying rows in the first sub-array 210 as first or second row groups may be performed by defining the first and second row groups according to a row address of each row in the first sub-array 210. In addition, classifying rows in the second sub-array 220 as first or second row groups may be performed by defining the first and second row groups according to a row address of each row in the second sub-array 220.

In an embodiment, the first row groups of the first and second sub-arrays 210 and 220 may be defined as rows, each of which has a row address whose third bit (i.e., LSB) has a value of '0'. The second row groups of the first and second sub-arrays 210 and 220 may be defined as rows, each of which has a row address whose third bit (i.e., LSB) has a value of '1'. That is, the first row group may include even-numbered rows (i.e., '000', '010', '100', and '110') among the rows in the first sub-array 210 and the second sub-array 220, and the second row group may include odd-numbered rows (i.e., '001', '011', '101', '111') among the rows in the first sub-array 210 and the second sub-array 220.

Accordingly, the first row group of the first sub-array 210 may include the first row having a row address of '000' and the third row having a row address of '010', and the first row group of the second sub-array 220 may include the first row having a row address of '100' and the third row having a row address of '110'. In addition, the second row group of the first sub-array 210 may include the second row having a row address of '001' and the fourth row having a row address of '011', and the second row group of the second sub-array 220 may include the second row having a row address of '101' and the fourth row having a row address of '111'.

Because the first row groups of the first and second sub-arrays 210 and 220 include the first faded unit cell 251 and the fourth failed unit cell 254, the number of failed unit cells 251 and 254 in the first row groups of the first and second sub-arrays 210 and 220 is not greater than the number of spare columns in any one of the first and second spare column regions 232 and 242. Similarly, because the second row groups of the first and second sub-arrays 210 and 220 include the second failed unit cell 252 and the third unit cell 253, the number of failed unit cells 252 and 253 in the second row groups of the first and second sub-arrays 210 and 220 is also not greater than the number of spare columns in any one of the first and second spare column regions 232 and 242.

Row addresses of the rows in the first and second row groups of the first sub-array 210 may have a first bit (i.e., an MSB) of '0' in common. Row addresses of the rows in the first and second row groups of the second sub-array 220 may have a first bit of '1' in common. Thus, whether a certain row belongs to the first sub-array 210 or the second sub-array 220 may be determined according to a value of the first bit (i.e., MSB) in a row address of the certain row. All the rows belonging to the first row groups of the first and second sub-arrays 210 and 220 may have row addresses, third bits (i.e., LSBs) having a value of '0' in common. All the rows belonging to the second row groups of the first and second sub-arrays 210 and 220 may have row addresses, third bits (i.e., LSBs) having a value of '1' in common. Accordingly, whether a certain row belongs to the first row group or the second row group may be determined according to a value of the third bit (i.e., LSB) in a row address of the certain row.

Figure 6:
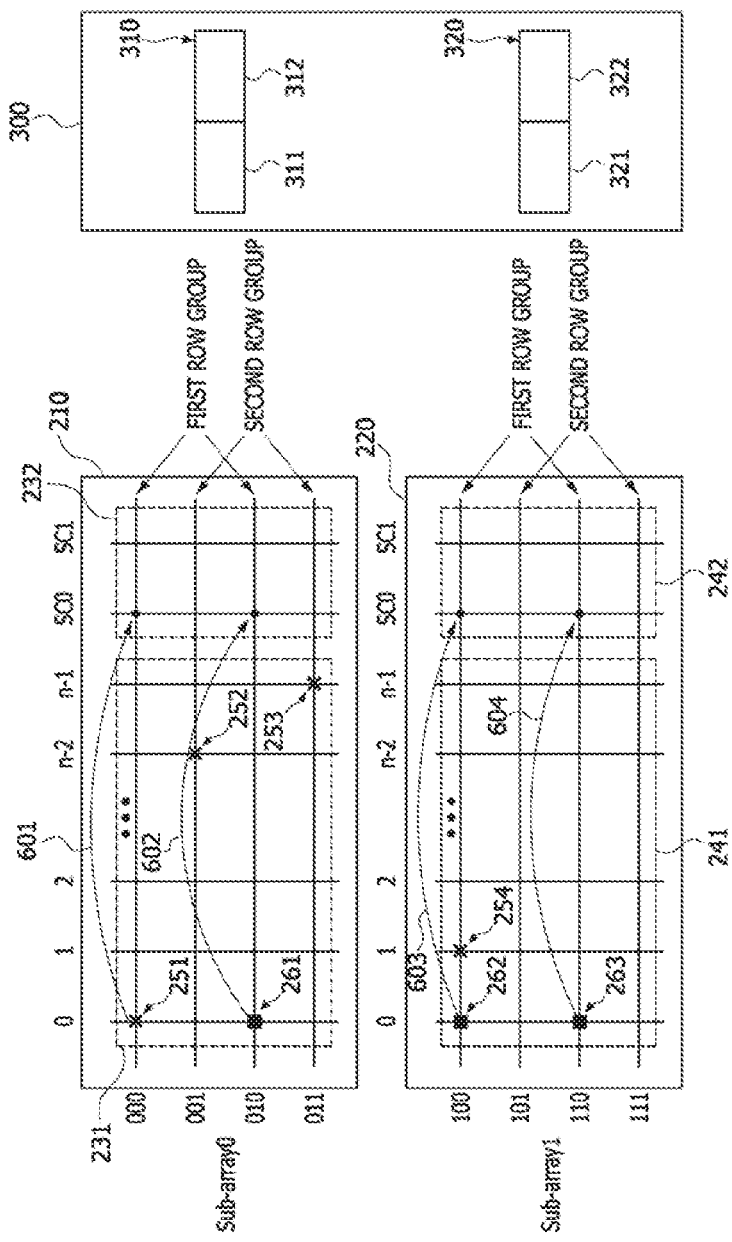

Referring to FIG. 6, after distribution of the failed unit cells 251, 252, 253, and 254 are obtained and the rows are classified as the first or second row group, the repair process of the failed unit cells may be performed. The repair process may be performed in units of row groups. First, the failed unit cells and the normal unit cells in the first row group of the first sub-array 210 may be replaced by spare unit cells in one of the first and second spare columns of the first sub-array 210. Specifically, the first main column (having a column address of '0') including the first failed unit cell 251 in the first sub-array 210 may be repaired using the first spare column SC0 of the first sub-array 210. Because the repair process is performed in units of row groups, all the main unit cells in the first column of the first sub-array 210 are not replaced by all the spare unit cells in the first spare column SC0 of the first sub-array 210. Thus, as denoted by arrow 601, the first failed unit cell 251 in the first row of the first main column may be replaced by the spare unit cell in the first row of the first spare column SC0. In addition, as denoted by arrow 602, a normal unit cell 261 in the third row of the first main column may be replaced by the spare unit cell in the third row of the first spare column SC0.

The first row group of the second sub-array 220 may also be repaired using substantially the same method as used in repairing the first row group of the first sub-array 210. Thus, as denoted by arrow 603, a normal unit cell 262 in the first row belonging to the first row group among the main unit cells of the first main column of the second sub-array 220 may be replaced by the spare unit cell in the first row of the first spare column SC0 of the second sub-array 220. In addition, as denoted by arrow 604, a normal unit cell 263 in the third row belonging to the first row group among the main unit cells of the first main column of the second sub-array 220 may be replaced by the spare unit cell in the third row of the first spare column SC0 of the second sub-array 220.

Figure 7:
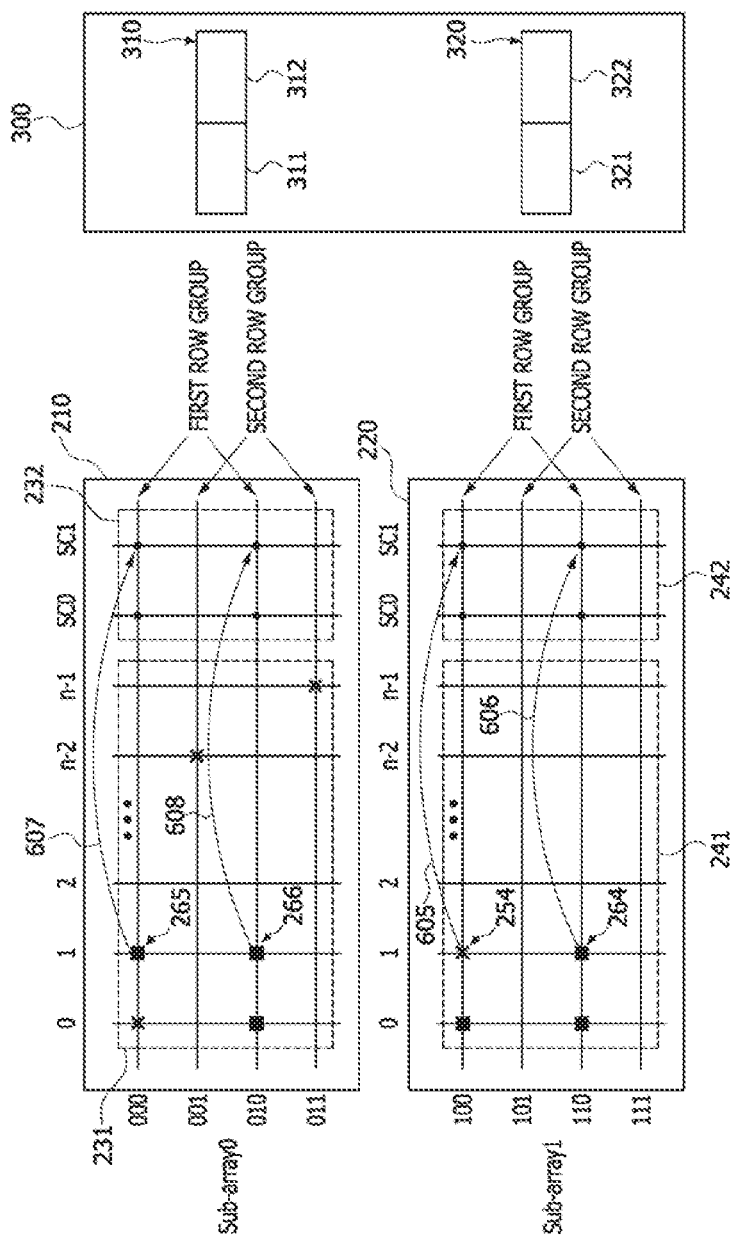

Referring to FIG. 7, the second main column (having a column address of '1') including the fourth failed unit cell 254 among the main columns of the first row group in the second sub-array 220 may be repaired using the second spare column SC1 of the second sub-array 220. Because the spare unit cells in the first row group of the first spare column SC0 of the second sub-array 220 have already been used in repairing the first main column (having a column address of '0') of the second sub-array 220, it may be impossible to use the spare unit cells in the first row group of the first spare column SC0 of the second sub-array 220 in any other repair process. Because the repair process is performed in units of row groups, all the main unit cells in the second main column of the second sub-array 220 are not replaced by all the spare unit cells in the second spare column SC1 of the second sub-array 220. Thus, as denoted by arrow 605, the fourth failed unit cell 254 in the first row of the second main column may be replaced by the spare unit cell in the first row of the second spare column SC1. In addition, as denoted by arrow 606, a normal unit cell 264 in the third row of the second main column may be replaced by the spare unit cell in the third row of the second spare column SC1.

The first row group of the first sub-array 210 may also be repaired using substantially the same method as used in repairing the first row group of the second sub-array 220. Thus, as denoted by arrow 607, a normal unit cell 265 in the first row belonging to the first row group among the main unit cells of the second main column of the first sub-array 210 may be replaced by the spare unit cell in the first row of the second spare column SC1 of the first sub-array 210. In addition, as denoted by arrow 608, a normal unit cell 266 in the third row belonging to the first row group among the main unit cells of the second main column of the first sub-array 210 may be replaced by the spare unit cell in the third row of the second spare column SC1 of the first sub-array 210.

Figure 8:
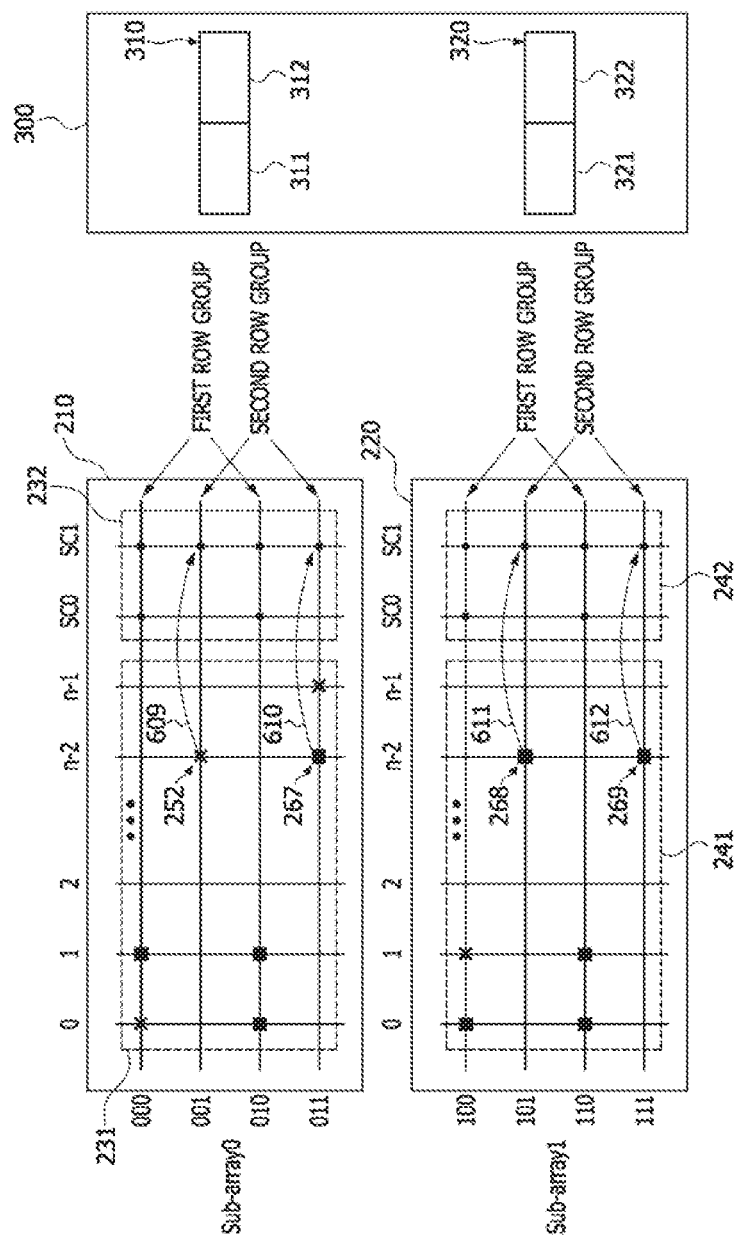

Referring to FIG. 8, the $(N-1)^{th}$ main column (having a column address of '(n-2)') including the second failed unit cell 252 among the main columns of the first sub-array 210 may be repaired using the second spare column SC1 of the first sub-array 210. Because the repair process is performed in units of row groups, all the main unit cells in the $(N-1)^{th}$ main column of the first sub-array 210 are not replaced by all the spare unit cells in the second spare column SC1 of the first sub-array 210. Thus, as denoted by arrow 609, the second failed unit cell 252 in the second row of the $(N-1)^{th}$ main column may be replaced by the spare unit cell in the second row of the second spare column SC1. In addition, as denoted by arrow 610, a normal unit cell 267 in the fourth row of the $(N-1)^{th}$ main column may be replaced by the spare unit cell in the fourth row of the second spare column SC1.

The second row group of the second sub-array 220 may also be repaired using substantially the same method as used in repairing the second row group of the first sub-array 210. Thus, as denoted by arrow 611, a normal unit cell 268 in the second row belonging to the second row group among the main unit cells of the $(N-1)^{th}$ main column of the second sub-array 220 may be replaced by the spare unit cell in the second row of the second spare column SC1 of the second sub-array 220. In addition, as denoted by arrow 612, a normal unit cell 269 in the fourth row belonging to the second row group among the main unit cells of the $(N-1)^{th}$ main column of the second sub-array 220 may be replaced by the spare unit cell in the fourth row of the second spare column SC1 of the second sub-array 220.

Figure 9:
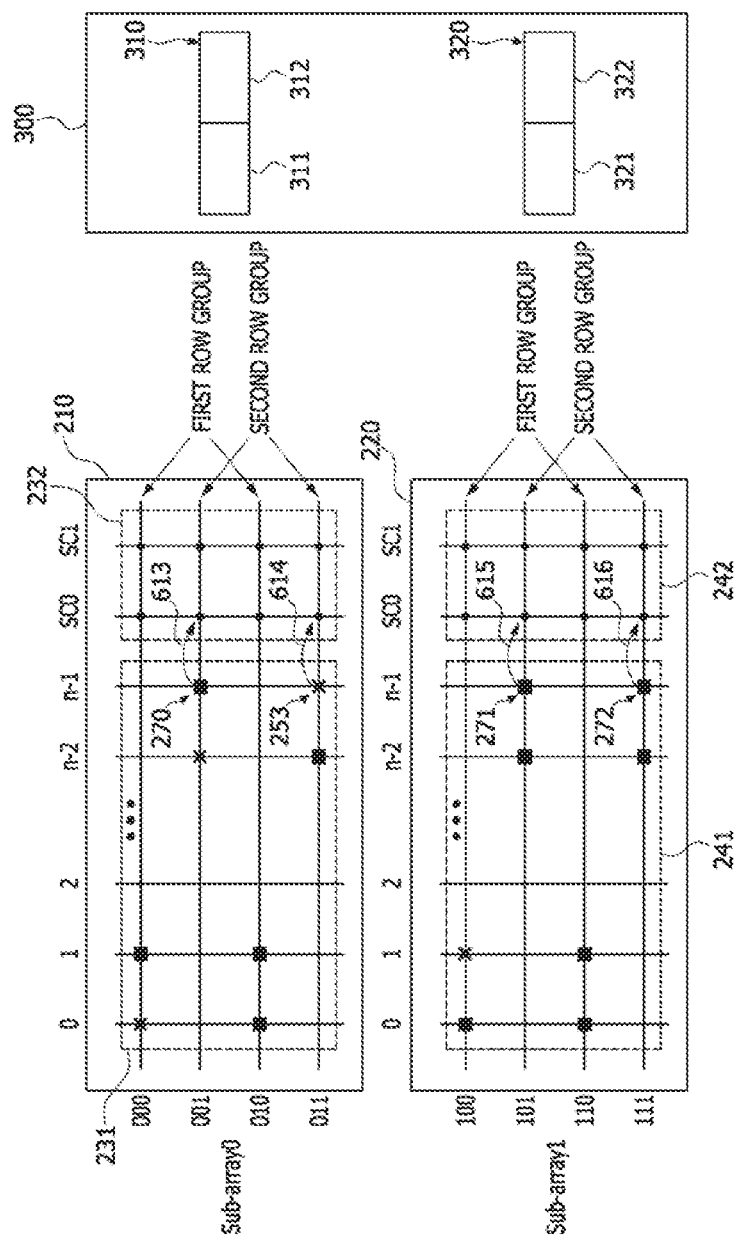

Referring to FIG. 9, the $N^{th}$ main column (having a column address of '(n-1)') including the third failed unit cell 253 among the main columns of the first sub-array 210 may be repaired using the first spare column SC0 of the first sub-array 210. Because the repair process is performed in units of row groups, only the main unit cells in the second row groups among the main unit cells in the $N^{th}$ main column of the first sub-array 210 may be replaced by the spare unit cells in the second row group of the first spare column SC0 of the first sub-array 210. Thus, as denoted by arrow 613, a normal unit cell 270 in the second row of the $N^{th}$ main column may be replaced by the spare unit cell in the second row of the first spare column SC0. In addition, as denoted by arrow 614, the third failed unit cell 253 in the fourth row of the $N^{th}$ main column may be replaced by the spare unit cell in the fourth row of the first spare column SC0.

The second row group of the second sub-array 220 may also be repaired using substantially the same method as used in repairing the second row group of the first sub-array 210. Thus, as denoted by arrow 615, a normal unit cell 271 in the second row belonging to the second row group among the main unit cells of the $N^{th}$ main column of the second sub-array 220 may be replaced by the spare unit cell in the second row of the first spare column SC0 of the second sub-array 220. In addition, as denoted by arrow 616, a normal unit cell 272 in the fourth row belonging to the second row group among the main unit cells of the $N^{th}$ main column of the second sub-array 220 may be replaced by the spare unit cell in the fourth row of the first spare column SC0 of the second sub-array 220.

After the main columns having failed unit cells in the first and second sub-arrays 210 and 220 are repaired, a process of remapping the column addresses of the repaired main columns in the first and second sub-arrays 210 and 220 may be performed using the spare column remap storage (SCRS) 300. However, in some other embodiments, the column address remapping process may be performed during the repair process. For example, the process of remapping the column addresses of the repaired main columns in the first row groups may be performed after the first row groups in the first and second sub-arrays 210 and 220 are repaired, and the process of remapping the column addresses of the repaired main columns in the second row groups may be performed after the second row groups in the first and second sub-arrays 210 and 220 are repaired. Alternatively, the process of remapping the column addresses of the repaired main columns in the second row groups may be performed after the second row groups in the first and second sub-arrays 210 and 220 are repaired, and the process of remapping the column addresses of the repaired main columns in the first row groups may be performed after the first row groups in the first and second sub-arrays 210 and 220 are repaired. That is, a sequence of the repair process of the first and second row groups and the column address remapping process of the first and second row groups may be changed.

Figure 10:
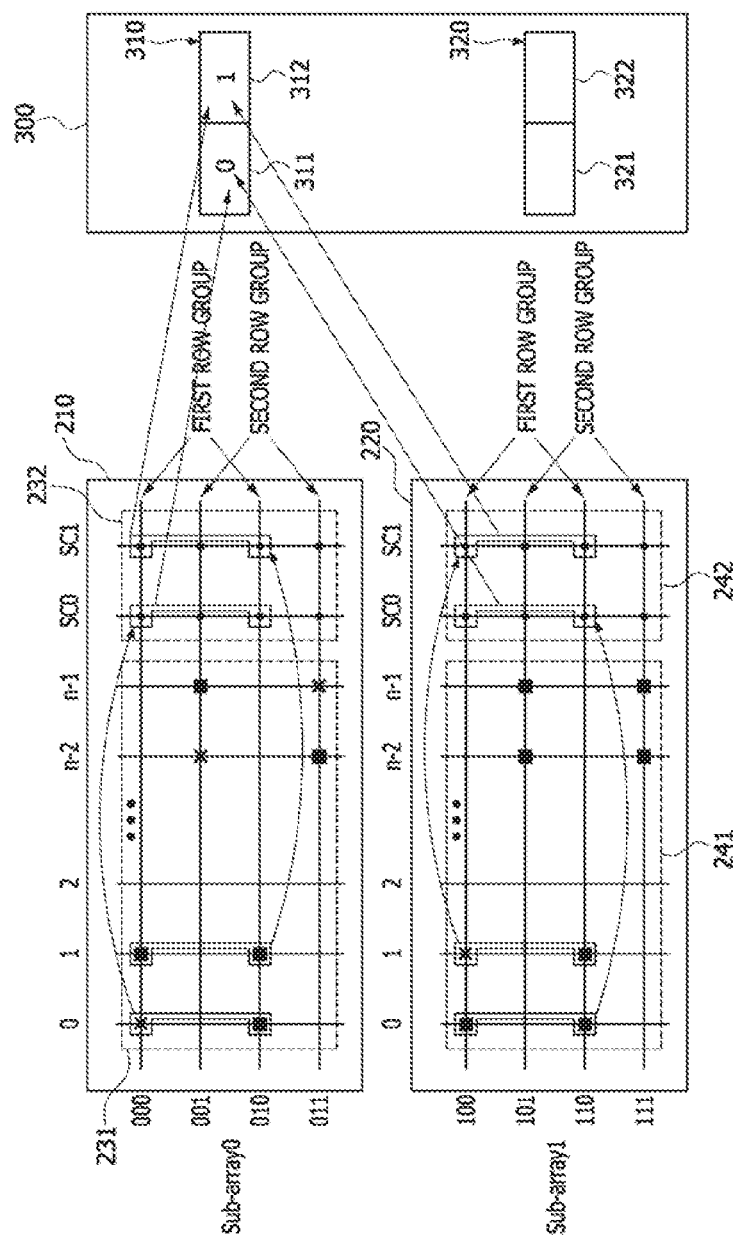

Referring to FIG. 10, the first storage unit 310 of the spare column remap storage (SCRS) 300 may include storage elements which are virtually allocated to the first row group in the first sub-array 210 and the first row group in the second sub-array 220. Specifically, column address information of the main columns having main unit cells replaced by spare unit cells of the first row groups in the first spare columns SC0 of the first and second sub-arrays 210 and 220 may be stored in the first virtual address storage element 311 of the first storage unit 310 of the spare column remap storage (SCRS) 300. In addition, column address information of the main columns having main unit cells replaced by spare unit cells of the first row groups in the second spare columns SC1 of the first and second sub-arrays 210 and 220 may be stored in the second virtual address storage element 312 of the first storage unit 310 of the spare column remap storage (SCRS) 300. Thus, a value '0' corresponding to column addresses of the first main columns of the first and second sub-arrays 210 and 220 may be stored in the first virtual address storage element 311 of the first storage unit 310 of the spare column remap storage (SCRS) 300, and a value corresponding to column addresses of the second main columns of the first and second sub-arrays 210 and 220 may be stored in the second virtual address storage element 312 of the first storage unit 310 of the spare column remap storage (SCRS) 300.

Figure 11:
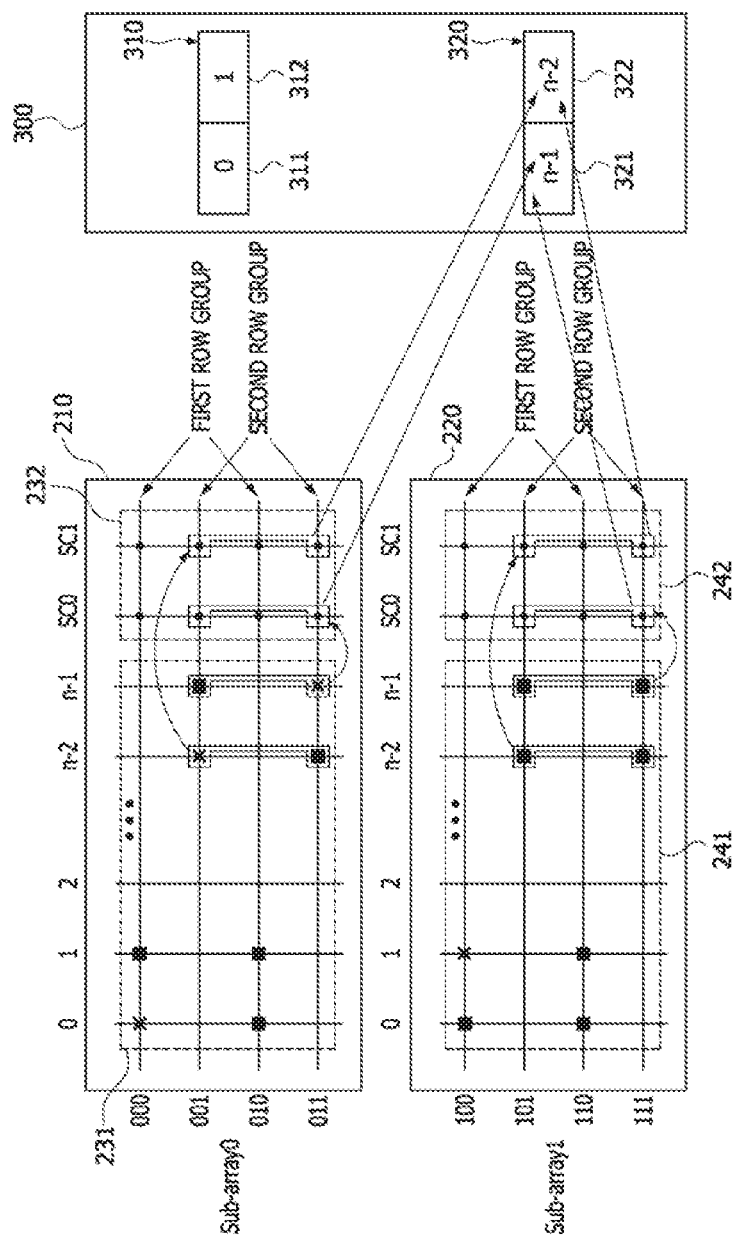

Referring to FIG. 11, the second storage unit 320 of the spare column remap storage (SCRS) 300 may include storage elements which are virtually allocated to the second row group in the first sub-array 210 and the second row group in the second sub-array 220. Specifically, column address information of the main columns having main unit cells replaced by spare unit cells of the second row groups in the first spare columns SC0 of the first and second sub-arrays 210 and 220 may be stored in the first virtual address storage element 321 of the second storage unit 320 of the spare column remap storage (SCRS) 300. In addition, column address information of the main columns having main unit cells replaced by spare unit cells of the second row groups in the second spare columns SC1 of the first and second sub-arrays 210 and 220 may be stored in the second virtual address storage element 322 of the second storage unit 320 of the spare column remap storage (SCRS) 300. Thus, a value '(n−1)' corresponding to column addresses of the $N^{th}$ main columns of the first and second sub-arrays 210 and 220 may be stored in the first virtual address storage element 321 of the second storage unit 320 of the spare column remap storage (SCRS) 300, and a value '(n−2)' corresponding to column addresses of the $(N-1)^{th}$ main columns of the first and second sub-arrays 210 and 220 may be stored in the second virtual address storage element 322 of the second storage unit 320 of the spare column remap storage (SCRS) 300.

Figure 12:
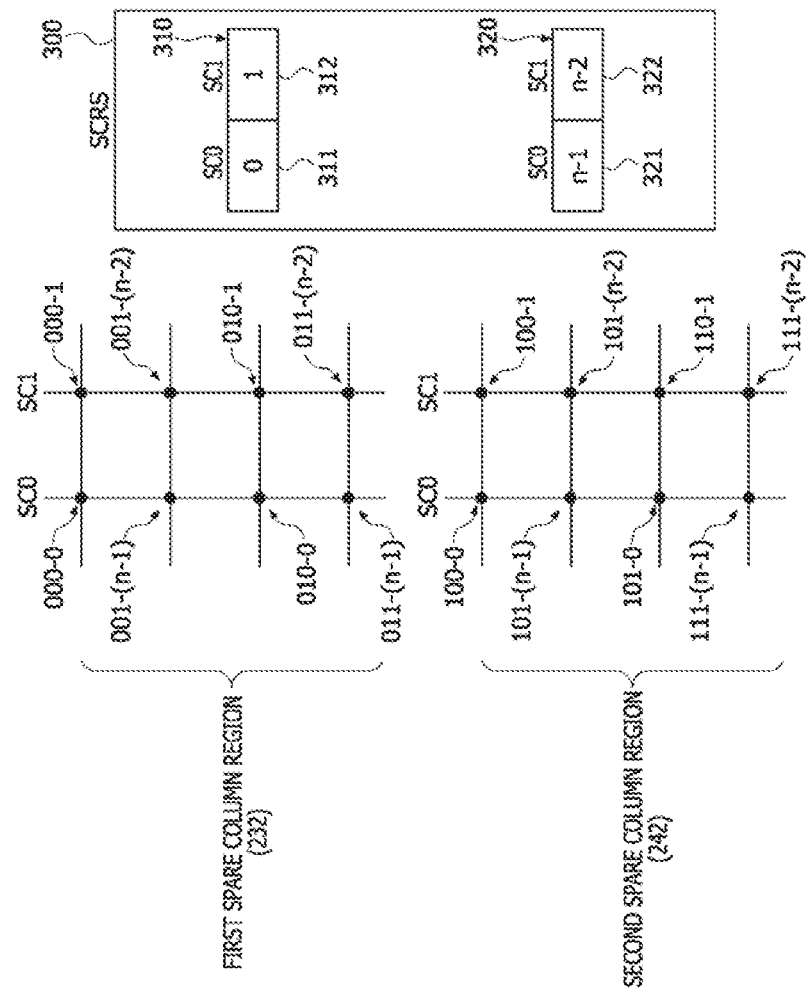
FIG. 12 is a schematic view illustrating a first spare column region and a second spare column region together with a spare column remap storage in which column addresses are remapped according to the embodiment described with reference to FIGS. 5 to 11.

FIG. 12 is a schematic view illustrating the first spare column region 232 and the second spare column region 242 of the data storage region 200 together with the spare column remap storage (SCRS) 300 in which column addresses are virtually remapped according to the embodiment described with reference to FIGS. 5 to 11. Referring to FIG. 12, that a column address of '0' is stored in the first virtual address storage element 311 of the first storage unit 310 of the SCRS 300 may mean that the main unit cells in the first row group (i.e., the main unit cells in the first row and the third row of the first main column) among the main unit cells in the first main column (having a column address of '0') of the first sub-array 210 are replaced by the spare unit cells in the first row and the third row corresponding to the first row group of the first spare column SC0 of the first sub-array 210. This may also mean that the main unit cells in the first row group (i.e., the main unit cells in the first row and the third row of the first main column) among the main unit cells in the first main column (having a column address of '0') of the second sub-array 220 are replaced by the spare unit cells in the first row and the third row corresponding to the first row group of the first spare column SC0 of the second sub-array 220.

Accordingly, the main unit cells in the first main column of the first sub-array 210 replaced by the spare unit cells of the first row group in the first spare column SC0 of the first spare column region 232 may be disposed at a position denoted by a row address of '000' and a column address of '0' as well as a position denoted by a row address of '010' and a column address of '0', respectively. Similarly, the main unit cells in the first main column of the second sub-array 220 replaced by the spare unit cells of the first row group in the first spare column SC0 of the second spare column region 242 may be disposed at a position denoted by a row address of '100' and a column address of '0' as well as a position denoted by a row address of '110' and a column address of '0', respectively.

Thus, if a read command for reading out a datum stored in the main unit cell selected by a row address of '000' and a column address of '0' is generated, a datum stored in the spare unit cell having a row address of '000' among the spare unit cells of the first row group in the first spare column SC0 of the first spare column region 232 (instead of a datum stored in the main unit cell disposed at a position denoted by a row address of '000' and a column address of '0') may be read out based on the column address information of '0' stored in the first virtual address storage element 311 of the first storage unit 310 of the SCRS 300.

That a column address of '1' is stored in the second virtual address storage element 312 of the first storage unit 310 of the SCRS 300 may mean that the main unit cells in the first row group (i.e., the main unit cells in the first row and the third row of the second main column) among the main unit cells in the second main column (having a column address of '1') of the first sub-array 210 are replaced by the spare unit cells in the first row and the third row corresponding to the first row group of the second spare column SC1 of the first sub-array 210. This may also mean that the main unit cells in the first row group (i.e., the main unit cells in the first row and the third row of the second main column) among the main unit cells in the second main column (having a column address of '1') of the second sub-array 220 are replaced by the spare unit cells in the first row and the third row corresponding to the first row group of the second spare column SC1 of the second sub-array 220.

Accordingly, the main unit cells in the second main column of the first sub-array 210 replaced by the spare unit cells of the first row group in the second spare column SC1 of the first spare column region 232 may be disposed at a position denoted by a row address of '000' and a column address of '1' as well as a position denoted by a row address of '010' and a column address of '1', respectively. Similarly, the main unit cells in the second main column of the second sub-array 220 replaced by the spare unit cells of the first row group in the second spare column SC1 of the second spare column region 242 may be disposed at a position denoted by a row address of '100' and a column address of '1' as well as a position denoted by a row address of '110' and a column address of '1', respectively.

Thus, if a read command for reading out a datum stored in the main unit cell selected by a row address of '000' and a column address of '1' is generated, a datum stored in the spare unit cell having a row address of '000' among the spare unit cells of the first row group in the second spare column SC1 of the first spare column region 232 (instead of a datum stored in the main unit cell disposed at a position denoted by a row address of '000' and a column address of '1') may be read out based on the column address information of '1' stored in the second virtual address storage element 312 of the first storage unit 310 of the SCRS 300.

That a column address of '(n−1)' is stored in the first virtual address storage element 321 of the second storage unit 320 of the SCRS 300 may mean that the main unit cells in the second row group (i.e., the main unit cells in the second row and the fourth row of the $N^{th}$ main column) among the main unit cells in the $N^{th}$ main column (having a column address of '(n−1)') of the second sub-array 220 are replaced by the spare unit cells in the second row and the fourth row corresponding to the second row group of the first spare column SC0 of the second sub-array 220. This may also mean that the main unit cells in the second row group (i.e., the main unit cells in the second row and the fourth row of the $N^{th}$ main column) among the main unit cells in the $N^{th}$ main column (having a column address of '(n−1)') of the first sub-array 210 are replaced by the spare unit cells in the second row and the fourth row corresponding to the second row group of the first spare column SC0 of the first sub-array 210.

Accordingly, the main unit cells in the $N^{th}$ main column of the first sub-array 210 replaced by the spare unit cells of the second row group in the first spare column SC0 of the first spare column region 232 may be disposed at a position denoted by a row address of '001' and a column address of '(n−1)' as well as a position denoted by a row address of '011' and a column address of '(n−1)', respectively. Similarly, the main unit cells in the $N^{th}$ main column of the second sub-array 220 replaced by the spare unit cells of the second row group in the first spare column SC0 of the second spare column region 242 may be disposed at a position denoted by a row address of '101' and a column address of '(n−1)' as well as a position denoted by a row address of '111' and a column address of '(n−1)', respectively.

Thus, if a read command for reading out a datum stored in the main unit cell selected by a row address of '001' and a column address of '(n−1)' is generated, a datum stored in the spare unit cell having a row address of '001' among the spare unit cells of the second row group in the first spare column SC0 of the first spare column region 232 (instead of a datum stored in the main unit cell disposed at a position denoted by a row address of '001' and a column address of '(n−1)') may be read out based on the column address information of '(n−1)' stored in the first virtual address storage element 321 of the second storage unit 320 of the SCRS 300.

That a column address of '(n−2)' is stored in the second virtual address storage element 322 of the second storage unit 320 of the SCRS 300 may mean that the main unit cells in the second row group (i.e., the main unit cells in the second row and the fourth row of the $(N-1)^{th}$ main column) among the main unit cells in the $(N-1)^{h}$ main column (having a column address of '(n−2)') of the second sub-array 220 are replaced by the spare unit cells in the second row and the fourth row corresponding to the second row group of the second spare column SC1 of the second sub-array 220. This may also mean that the main unit cells in the second row group (i.e., the main unit cells in the second row and the fourth row of the $(N-1)^{th}$ main column) among the main unit cells in the $(N-1)^{th}$ main column (having a column address of '(n−2)') of the first sub-array 210 are replaced by the spare unit cells in the second row and the fourth row corresponding to the second row group of the second spare column SC1 of the first sub-array 210.

Accordingly, the main unit cells in the $(N-1)^{th}$ main column of the first sub-array 210 replaced by the spare unit cells of the second row group in the second spare column SC1 of the first spare column region 232 may be disposed at a position denoted by a row address of '001' and a column address of '(n−2)' as well as a position denoted by a row address of '011' and a column address of '(n−2)', respectively. Similarly, the main unit cells in the $(N-1)^{th}$ main column of the second sub-array 220 replaced by the spare unit cells of the second row group in the second spare column SC1 of the second spare column region 242 may be disposed at a position denoted by a row address of '101' and a column address of '(n−2)' as well as a position denoted by a row address of '111' and a column address of '(n−2)', respectively.

Thus, if a read command for reading out a datum stored in the main unit cell selected by a row address of '001' and a column address of '(n−2)' is generated, a datum stored in the spare unit cell having a row address of '001' among the spare unit cells of the second row group in the second spare column SC1 of the first spare column region 232 (instead of a datum stored in the main unit cell disposed at a position denoted by a row address of '001' and a column address of '(n−2)') may be read out based on the column address information of '(n−2)' stored in the second virtual address storage element 322 of the second storage unit 320 of the SCRS 300.

Figure 13:
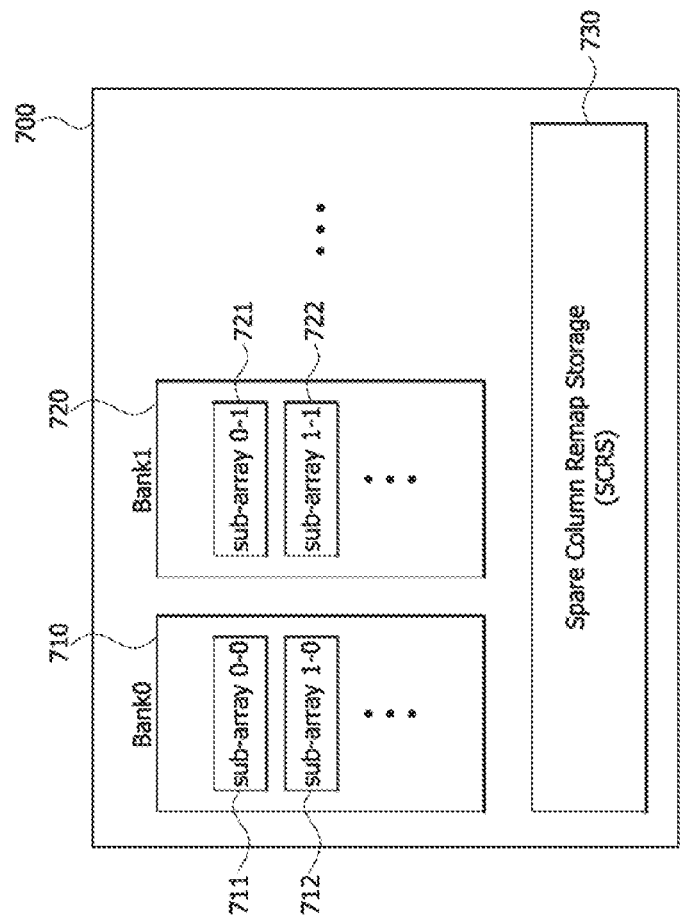
FIG. 13 is a block diagram illustrating a memory device according to another embodiment of the present disclosure.

FIG. 13 is a block diagram illustrating a memory device 700 according to another embodiment of the present disclosure. Referring to FIG. 13, the memory device 700 may be configured to include a plurality of banks 710, 720, . . . and a spare column remap storage (SCRS) 730. The spare column remap storage (SCRS) 730 may be disposed to be separated from the plurality of banks 710, 720, . . . . Each of the plurality of banks 710, 720, . . . may include a plurality of sub-arrays. For example, the first bank 710 may include a plurality of sub-arrays 711, 712, . . . . Similarly, the second bank 720 may include a plurality of sub-arrays 721, 722, . . . . The sub-arrays included in each of the plurality of banks 710, 720, . . . may be disposed to have the same configuration as the sub-arrays 210 and 220 described with reference to FIGS. 1 to 12. The spare column remap storage (SCRS) 730 may be configured to include a plurality of storage units, like the SCRS 300 described with reference to FIG. 1. The number of the plurality of storage units included in the SCRS 730 may be equal to the number of the sub-arrays included in the memory device 700. The memory device 700 may be configured so that column addresses remapped by repair of the sub-arrays in each of the banks 710, 720, . . . are virtually allocated and stored in the SCRS 730 separated from the plurality of banks 710, 720, . . . without distinction of the banks 710, 720, . . . .

Figure 14:
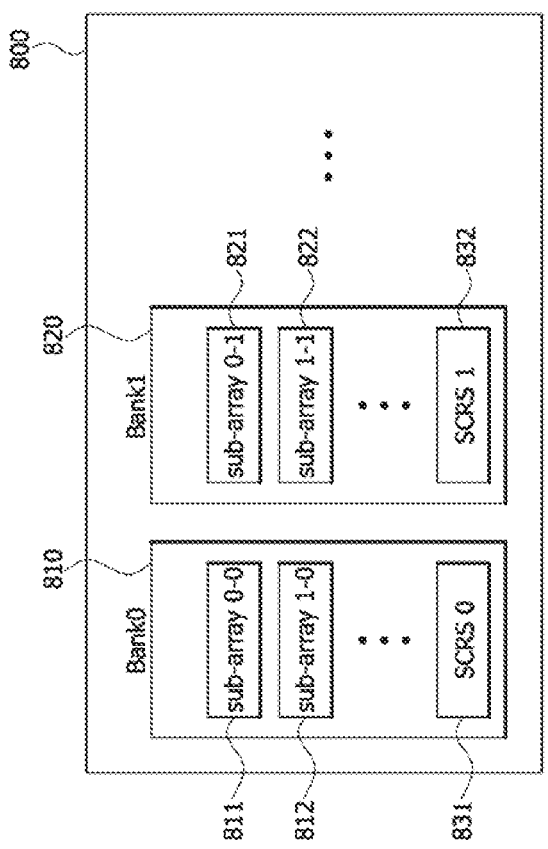
FIG. 14 is a block diagram illustrating a memory device according to yet another embodiment of the present disclosure.

FIG. 14 is a block diagram illustrating a memory device 800 according to yet another embodiment of the present disclosure. Referring to FIG. 14, the memory device 800 may be configured to include a plurality of banks 810, 820, . . . . Each of the plurality of banks 810, 820, . . . may include a plurality of sub-arrays and a spare column remap storage (SCRS). For example, the first bank 810 may include a plurality of sub-arrays 811, 812, . . . and a first spare column remap storage (SCRS0) 831. Similarly, the second bank 820 may include a plurality of sub-arrays 821, 822, . . . and a second spare column remap storage (SCRS1) 832. The sub-arrays included in each of the plurality of banks 810, 820, . . . may be disposed to have the same configuration as the sub-arrays 210 and 220 described with reference to FIGS. 1 to 12. Each of the first and second spare column remap storage (SCRS0, SCRS1) 831 and 832 may be configured to include a plurality of storage units, like the SCRS 300 described with reference to FIG. 1. The total number of the plurality of storage units included in the first and second spare column remap storages (SCRS0 and SCRS1) 831 and 832 may be equal to the total number of sub-arrays included in the memory device 800. Column addresses remapped by repair of the sub-arrays in the first bank 810 may be virtually allocated and stored in the first spare column remap storage (SCRS0) 831 included in the first bank 810. Similarly, column addresses remapped by repair of the sub-arrays in the second bank 820 may be virtually allocated and stored in the second spare column remap storage (SCRS1) 832 included in the second bank 820.

Figure 15:
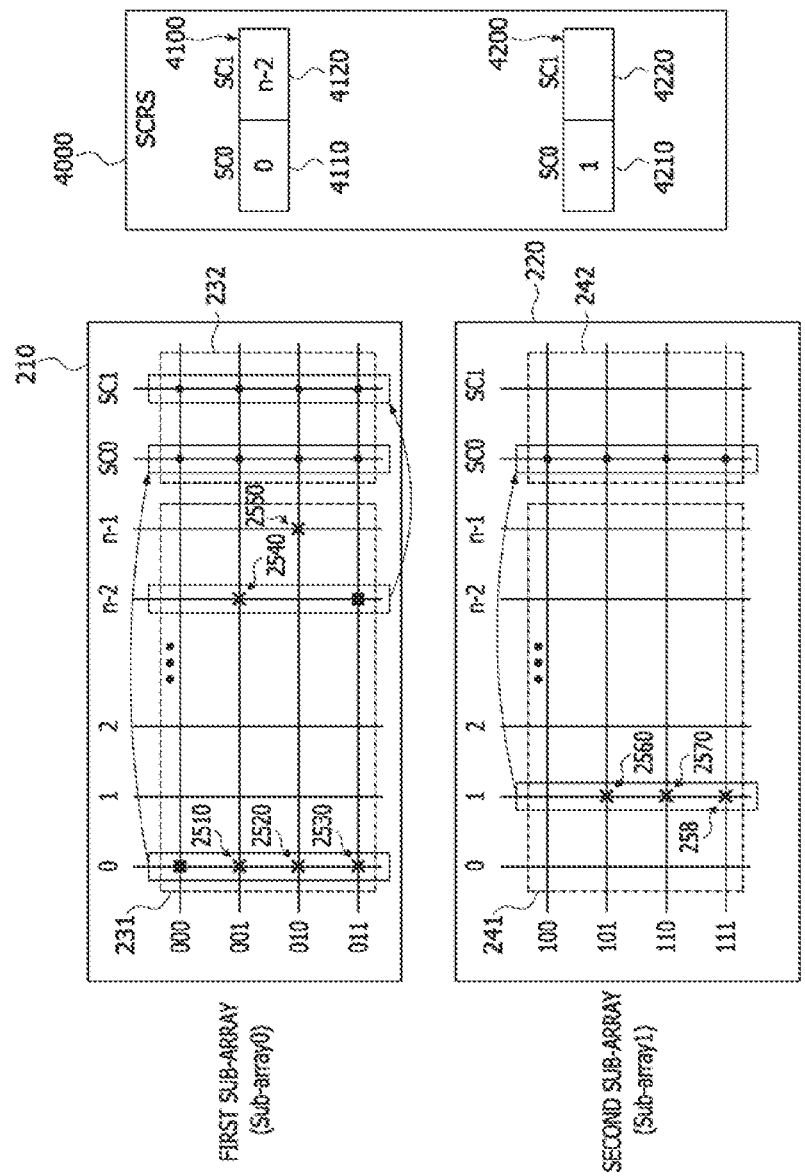
FIG. 15 is a schematic view illustrating another general method of repairing the first and second sub-arrays shown in FIG. 2 and another general method of remapping column addresses of repaired columns in the first and second sub-arrays using a spare column remap storage.

FIG. 15 is a schematic view illustrating another general method of repairing the first and second sub-arrays 210 and 220 shown in FIG. 2 and another general method of remapping column addresses of repaired columns in the first and second sub-arrays 210 and 220 using a spare column remap storage (SCRS) 4000. Referring to FIG. 15, the first and second sub-arrays 210 and 220 may have the same configuration as described with reference to FIGS. 1 and 2. The SCRS 4000 may include a first storage unit 4100 and a second storage unit 4200. The first storage unit 4100 of the SCRS 4000 may be physically allocated to the first sub-array 210, and the second storage unit 4200 of the SCRS 4000 may be physically allocated to the second sub-array 220. Thus, the first storage unit 4100 may store column address information of main columns which are repaired in the first sub-array 210, and the second storage unit 4200 may store the column address information of main columns which are repaired in the second sub-array 220.

The first storage unit 4100 of the SCRS 4000 may include a plurality of physical address storage elements (e.g., a first physical address storage element 4110 and a second physical address storage element 4120), the number of which is equal to the number of spare columns SC0 and SC1 in the first sub-array 210. The first physical address storage element 4110 of the first storage unit 4100 may store the column address information of a main column which is replaced by the first spare column SC0 of the first sub-array 210. The second physical address storage element 4120 of the first storage unit 4100 may store the column address information of a main column which is replaced by the second spare column SC1 of the first sub-array 210. The second storage unit 4200 of the SCRS 4000 may include a plurality of physical address storage elements (e.g., a first physical address storage element 4210 and a second physical address storage element 4220), the number of which is equal to the number of spare columns SC0 and SC1 in the second sub-array 220. The first physical address storage element 4210 of the second storage unit 4200 may store the column address information of a main column which is replaced by the first spare column SC0 of the second sub-array 220. The second physical address storage element 4220 of the second storage unit 4200 may store the column address information of a main column which is replaced by the second spare column SC1 of the second sub-array 220.

In order to perform a repair process and an address remapping process relating to the repair process, the main unit cells in the first and second sub-arrays 210 and 220 may be tested to verify whether each of the main unit cells operates normally. The main unit cells in the first and second sub-arrays 210 and 220 may be tested using various test patterns, for example, a checkerboard pattern and a march pattern. In an embodiment, testing the main unit cells in the first and second sub-arrays 210 and 220 may include generating a test pattern and writing data provided by the test pattern into the main unit cells. In addition, the data stored in the main unit cells may be read out by a read operation, and the data outputted from the main unit cells may be compared with the data provided by the test pattern. If the data outputted from the main unit cells is consistent with the data provided by the test pattern, all the main unit cells in the first and second sub-arrays 210 and 220 may be regarded as normal unit cells. In contrast, if a datum outputted from a certain one of the main unit cells is inconsistent with the corresponding datum of the data provided by the test pattern, the certain main unit cell may be regarded as a failed unit cell (or an abnormal unit cell).

In FIG. 15, it is assumed that the first main column region 231 has five failed unit cells and the second main column region 241 has three failed unit cells. Specifically, as indicated by symbols "x" in FIG. 15, a first failed unit cell 2510 may be located at a cross point of the second row and the first main column in the first main column region 231, a second failed unit cell 2520 may be located at a cross point of the third row and the first main column in the first main column region 231, a third failed unit cell 2530 may be located at a cross point of the fourth row and the first main column in the first main column region 231, a fourth failed unit cell 2540 may be located at a cross point of the second row and the $(N-1)^{th}$ main column (having a column address of '(n−2)') in the first main column region 231, and a fifth failed unit cell 2550 may be located at a cross point of the third row and the $N^{th}$ main column (having a column address of '(n−1)') in the first main column region 231. In addition, a sixth failed unit cell 2560 may be located at a cross point of the second row and the second main column in the second main column region 241, a seventh failed unit cell 2570 may be located at a cross point of the third row and the second main column in the second main column region 241, and an eighth failed unit cell 2580 may be located at a cross point of the fourth row and the second main column in the second main column region 241.

After distribution of the first to eighth failed unit cells 2510, 2520, 2530, 2540, 2550, 2560, 2570, and 2580 is obtained by the test result, a repair process may be performed. In general, the repair process may be performed in units of columns using spare columns. If the general repair process is applied to the first and second sub-arrays 210 and 220, all the main unit cells in the first main column (having a column address of '0') including the first to third failed unit cells 2510, 2520, and 2530 may be replaced by all the spare unit cells in the first spare column SC0 in the first sub-array 210, and all the main unit cells in the $(N-1)^{th}$ main column including the fourth failed unit cell 2540 may be replaced by all the spare unit cells in the second spare column SC1 in the first sub-array 210. In such a case, it may be impossible to repair the $N^{th}$ main column including the fifth failed unit cell 2550 because both the first and second spare columns SC0 and SC1 in the first sub-array 210 have already been used in repairing the first to fourth failed unit cells 2510~2540. Meanwhile, all the main unit cells in the second main column including the sixth to eighth failed unit cells 2560, 2570, and 2580 may be replaced by all the spare unit cells in the first spare column SC0 in the second sub-array 220.

A value '0' corresponding to the column address of the first main column replaced by the first spare column SC0 of the first sub-array 210 may be stored in the first physical address storage element 4110 of the first storage unit 4100 of the SCRS 4000. In addition, a value 'n–2' corresponding to the column address of the (N–1)$^{th}$ main column replaced by the second spare column SC1 of the first sub-array 210 may be stored in the second physical address storage element 4120 of the first storage unit 4100 of the SCRS 4000. Moreover, a value '1' corresponding to the column address of the second main column replaced by the first spare column SC0 of the second sub-array 220 may be stored in the first physical address storage element 4210 of the second storage unit 4200 of the SCRS 4000. Because the second sub-array 220 has no other repaired main column except for the second main column, no column address information is stored in the second physical address storage element 4220 of the second storage unit 4200 of the SCRS 4000.

In the general repair process and the general column address remapping process described above, the number of main columns including failed unit cells in the first sub-array 210 is three while the number of spare columns in the first sub-array 210 is two. Thus, only two of the three main columns including the failed unit cells in the first sub-array 210 may be repaired, and the remaining one of the three main columns cannot be repaired. In contrast, the number of main columns including the failed unit cells in the second sub-array 220 is one while the number of spare columns in the second sub-array 220 is two. Thus, one of the two spare columns in the second sub-array 220 is not used in repairing the failed unit cells in the second sub-array 220. Accordingly, any one of the first and second physical address storage elements 4210 and 4220 constituting the second storage unit 4200 may possibly not be used in repairing the second sub-array 220. Accordingly, no information is stored in any one of the first and second physical address storage elements 4210 and 4220 even after the general column address remapping process is performed.

In the general column address remapping process described with reference to FIG. 15, the first and second storage units 4100 and 4200 constituting the SCRS 4000 may be configured to physically correspond to the first and second sub-arrays 210 and 220, respectively. In addition, the repair process may be performed in units of columns. However, according to various embodiments of the present disclosure, a hybrid remapping process may be employed so that a 1:1 physical remapping process and a virtual remapping process are used to repair the first and second sub-arrays 210 and 220. In particular, at least one of a plurality of storage units constituting an SCRS may include a first address storage element having a 1:1 physical relation with a first sub-array and a second address storage element having a virtual relation with the first sub-array or a second sub-array in units of row groups. Thus, while the first address storage element stores the address information of a main column in the first sub-array replaced by a spare column in the first sub-array having a 1:1 physical relation, the second address storage element may store the address information of a main column repaired in the second sub-array. Alternatively, the second address storage element may store the address information of a main column repaired in the first sub-array according to the distribution of failed unit cells.

Figure 16:
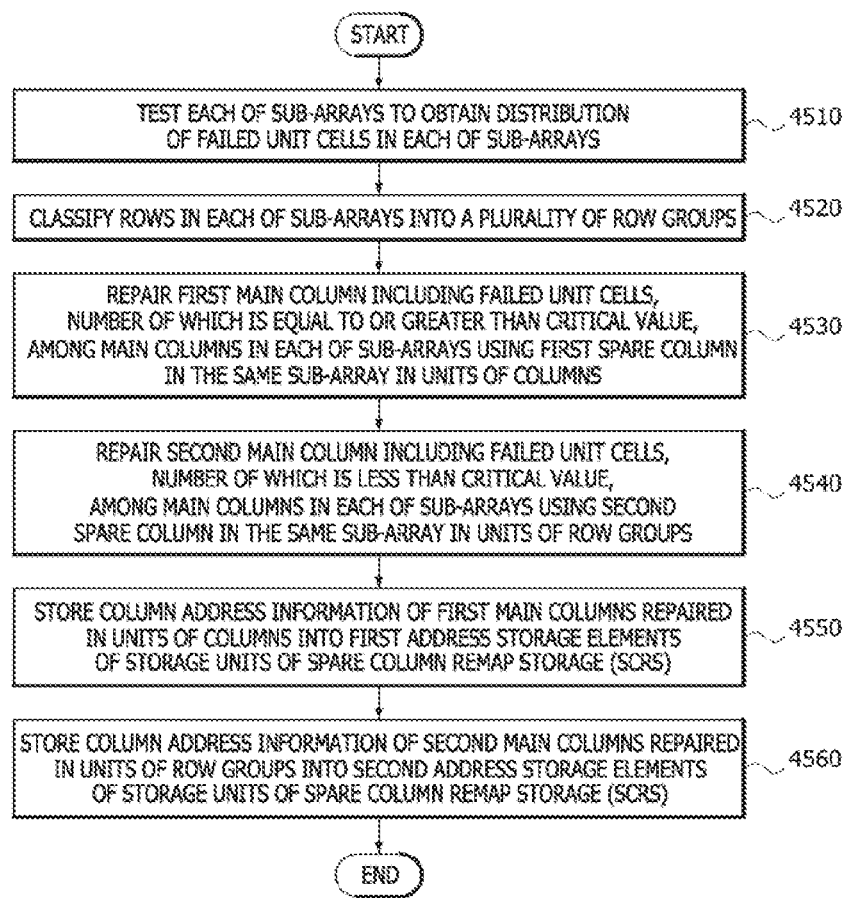
FIG. 16 is a flowchart illustrating a method of remapping column addresses with a spare column remap storage in a repair process of a memory device according to another embodiment of the present disclosure.

FIG. 16 is a flowchart illustrating a method of remapping column addresses with a spare column remap storage (SCRS) in a repair process of a memory device according to another embodiment of the present disclosure. Referring to FIG. 16, a plurality of sub-arrays may be tested to obtain a distribution of failed unit cells in each of the sub-arrays (see a step 4510). Rows in each of the sub-arrays may be classified into a plurality of row groups according to the distribution of the failed unit cells (see a step 4520). Thus, main unit cells and spare unit cells arrayed in each row of the sub-arrays may belong to any one of the row groups. After allocating each the rows to any one of the row groups, a main column having failed unit cells, the number of which is greater than or equal to a critical value, may be repaired in units of columns using a first spare column in the same sub-array (see a step 4530). If the number of rows in each sub-array is "L" and the number of spare columns in each sub-array is "S", the critical value may be a natural number which is greater than "L÷S". In the step 4530, all the main unit cells in a single main column repaired in units of columns may be replaced by all of spare unit cells in a first spare column in the same sub-array regardless of the row groups.

A main column including the failed unit cells, the number of which is less than the critical value, may be repaired using a second spare column in the same sub-array in units of row groups (see a step 4540). Thus, if a failed unit cell belonging to a first row group in a main column, all the main unit cells of the first row group in the main column may be replaced by all the spare unit cells of the first row group in the second spare column. In addition, if a failed unit cell belonging to a second row group in a main column, all the main unit cells of the second row group in the main column may be replaced by all the spare unit cells of the second row group in the second spare column.

After the repair process terminates, a column address remapping process may be performed. Specifically, column address information of the main column repaired in units of columns may be stored in a first address storage element of a first storage unit of a spare column remap storage (SCRS) (see a step 4550). Column address information of the main column repaired in units of row groups may be stored in a second address storage element of the first storage unit of the spare column remap storage (SCRS) (see a step 4560). In more detail, column address information of the main column including the failed unit cell belonging to the first row group may be stored in the second address storage element of the first storage unit of the spare column remap storage (SCRS). Moreover, column address information of the main column including the failed unit cell belonging to the second row group may be stored in the second address storage element of the second storage unit of the spare column remap storage (SCRS). As a result of the column address remapping process, the column address information of the main column repaired in units of columns in a first sub-array may be stored in the first address storage element of the first storage unit of the SCRS, and the column address information of the main column including the failed unit cells belonging to the first row group may be stored in the second address storage element of the first storage unit of the SCRS. Furthermore, the column address information of the main column repaired in units of columns in a second sub-array may be stored in the first address storage element of the second storage unit of the SCRS, and the column address information of the main column including the failed unit cells belonging to the second row group may be stored in the second address storage element of the second storage unit of the SCRS.

FIGS. 17 to 22 are schematic views illustrating in detail a method of remapping column addresses with the spare column remap storage 300 in a repair process of a memory device according to another embodiment of the present disclosure. In FIGS. 17 to 22, the same reference numerals as used in FIGS. 1 and 2 denote the same elements. The present embodiment will be described hereinafter in conjunction with an example in which the memory device 100 includes the first sub-array 210 and the second sub-array 220. However, a column address remapping process described in the present embodiment may be equally applicable to other memory devices including three or more sub-arrays.

Figure 17:
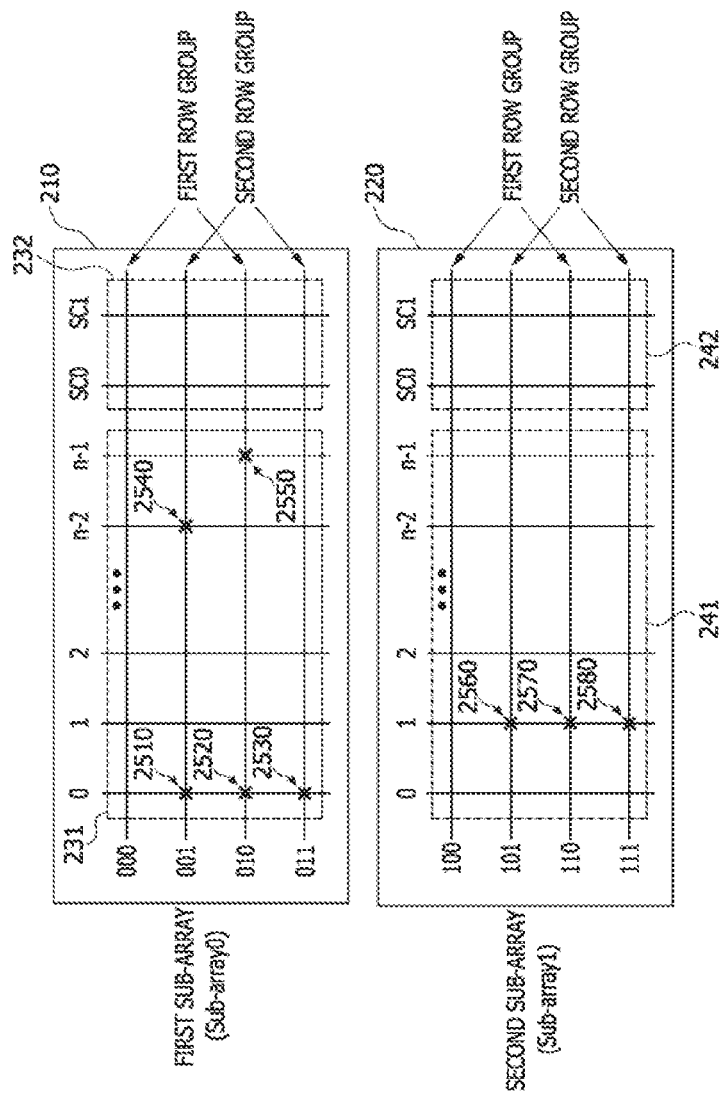
FIGS. 17 to 22 are schematic views illustrating in detail a method of remapping column addresses with a spare column remap storage in a repair process of a memory device according to another embodiment of the present disclosure.

Referring to FIG. 17, the main unit cells in the first main column region 231 of the first sub-array 210 and the main unit cells in the second main column region 241 of the second sub-array 220 may be tested to obtain a distribution of failed unit cells. The column address remapping method according to the present embodiment will be described in conjunction with an example in which the distribution of the failed unit cells obtained by a test of the main unit cells in the first and second main column regions 231 and 241 is the same as the distribution illustrated in FIG. 15. Thus, as indicated by symbols "x" in FIG. 17, the first failed unit cell 2510 may be located at a cross point of the second row and the first main column in the first main column region 231, the second failed unit cell 2520 may be located at a cross point of the third row and the first main column in the first main column region 231, the third failed unit cell 2530 may be located at a cross point of the fourth row and the first main column in the first main column region 231, the fourth failed unit cell 2540 may be located at a cross point of the second row and the $(N-1)^{th}$ main column (having a column address of '(n−2)') in the first main column region 231, and the fifth failed unit cell 2550 may be located at a cross point of the third row and the $N^{th}$ main column (having a column address of '(n−1)') in the first main column region 231. In addition, the sixth failed unit cell 2560 may be located at a cross point of the second row and the second main column in the second main column region 241, the seventh failed unit cell 2570 may be located at a cross point of the third row and the second main column in the second main column region 241, and the eighth failed unit cell 2580 may be located at a cross point of the fourth row and the second main column in the second main column region 241. The remaining main unit cells except for the first to eighth failed unit cells 2510~2580 may be regarded as normal unit cells.

After distribution of the failed unit cells is obtained, a repair process and a column address remapping process relating to the repair process may be performed. In order to perform the repair process and the column address remapping process, the rows in the first sub-array 210 may be categorized as either a first row group or a second row group. Similarly, the rows in the second sub-array 220 may be categorized as either the first row group or the second row group. The rows in the first and second sub-arrays 210 and 220 may be classified as the first row group or the second row group using any one of various methods according to the distribution of the failed unit cells included in each of the rows. In the present embodiment, the first row group may include even-numbered rows (i.e., '000', '010', '100', and '110) among the rows in the first sub-array 210 and the second sub-array 220, and the second row group may include odd-numbered rows (i.e., '001', '011', '101', '111') among the rows in the first sub-array 210 and the second sub-array 220.

According to the present embodiment, the first row having a row address of '000' and the third row having a row address of '010' in the first sub-array 210 may be allocated to the first row group, and the first row having a row address of '100' and the third row having a row address of '110' in the second sub-array 220 may be allocated to the first row group. In addition, the second row having a row address of '001' and the fourth row having a row address of '011' in the first sub-array 210 may be allocated to the second row group, and the second row having a row address of '101' and the fourth row having a row address of '111' in the second sub-array 220 may be allocated to the second row group.

In the present embodiment, row addresses of the rows belonging to the first row groups in the first and second sub-arrays 210 and 220 may have a third bit (i.e., an LSB) of '0' in common, and row addresses of the rows belonging to the second row groups in the first and second sub-arrays 210 and 220 may have a third bit (i.e., an LSB) of '1' in common. In addition, row addresses of the rows belonging to the first and second row groups in the first sub-array 210 may have a first bit (i.e., MSB) of '0' in common, and row addresses of the rows belonging to the first and second row groups in the second sub-array 220 may have a first bit (i.e., MSB) of '1' in common.

After distribution of the failed unit cells is obtained and the first and second row groups are defined, the repair processes of the failed unit cells may be performed as described with reference to the steps 4530 and 4540 in FIG. 16. In such a case, the repair processes may be performed by a hybrid repair process. The hybrid repair process may include repair processes performed in units of columns and repair processes performed in units of row groups. Specifically, the repair processes performed in units of columns may be executed in relation to the main columns including the failed unit cells, the number of which is greater than or equal to a critical value in each main column. In contrast, the repair processes performed in units of row groups may be executed in relation to the main columns including the failed unit cells, the number of which is less than the critical value in each main column. If the number of rows in each sub-array is "L" and the number of spare columns in each sub-array is "S", the critical value may be set to be a natural number which is greater than "L÷S" as described with reference to FIG. 4. In the present embodiment, because the number "L" of rows in each sub-array is four and the number "S" of spare columns in each sub-array is two, the critical value may be set to be a natural number which is greater than two. That is, the critical value may be set to be three.

If the critical value is three, the first main column having three failed unit cells (i.e., the first to third failed unit cells 2510, 2520, and 2530) among the main columns of the first sub-array 210 may be repaired in units of columns, and the second main column having three failed unit cells (i.e., the sixth to eighth failed unit cells 2560, 2570, and 2580) among the main columns of the second sub-array 220 may also be repaired in units of columns. In contrast, the main columns, each of which has two or less failed unit cells, may be repaired in units of row groups. That is, the $(N-1)^{th}$ main column (having a column address of '(n−2)') having one failed unit cell (i.e., the fourth failed unit cell 2540) among the main columns of the first sub-array 210 may be repaired in units of row groups, and the $N^{th}$ main column (having a column address of '(n−1)') having one failed unit cell (i.e., the fifth failed unit cell 2550) among the main columns of the first sub-array 210 may also be repaired in units of row groups.

Figure 18:
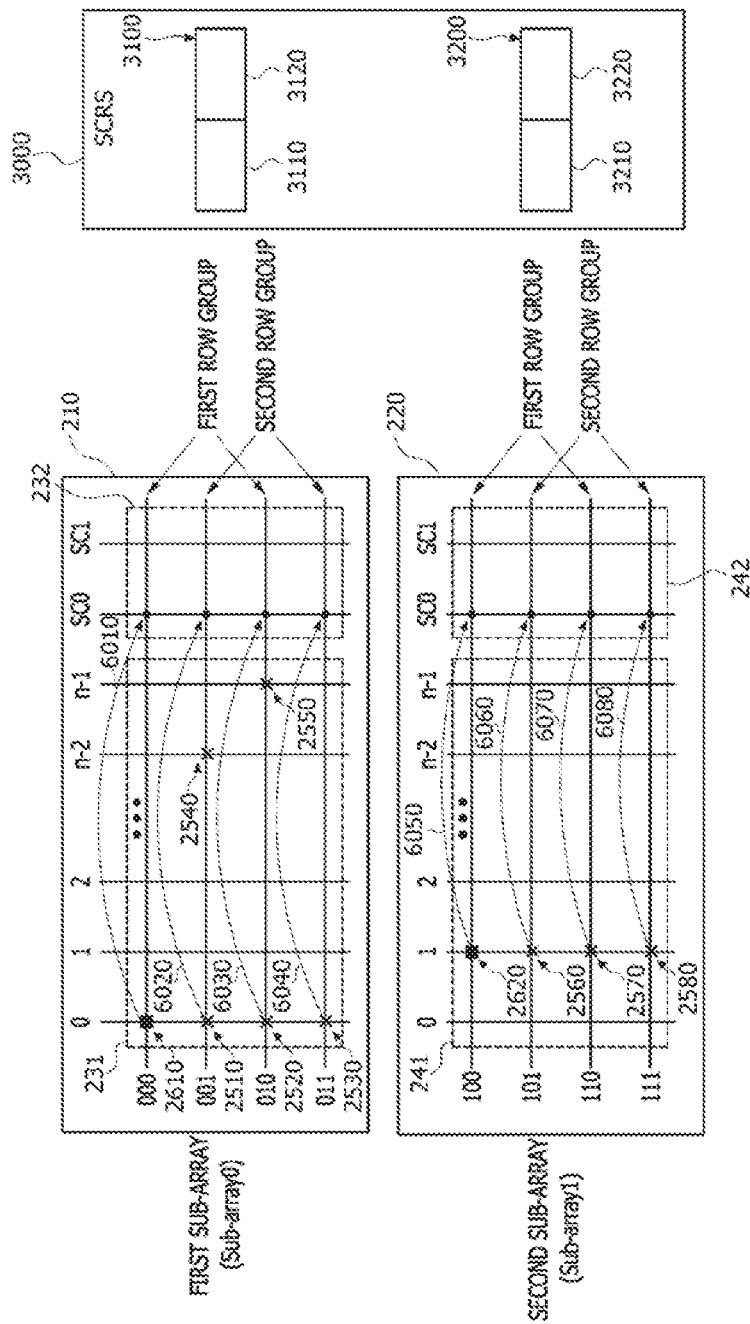

Hereinafter, the repair processes and the column address remapping processes in relation to the first to eighth failed unit cells 2510~2580 will be described in detail with reference to FIGS. 18 to 22. First, as illustrated in FIG. 18, the first main column having a column address of '0' among the main columns of the first sub-array 210 may have three failed unit cells (i.e., the first to third failed unit cells 2510, 2520, and 2530). Because the number of failed unit cells included in the first main column of the first sub-array 210 is equal to the critical value of '3', the first main column of the first sub-array 210 may be repaired in units of columns. Accordingly, all the main unit cells in the first main column of the first sub-array 210 may be replaced by all the spare unit cells in any one (e.g., the first spare column SC0) of the spare columns of the first sub-array 210. That is, as denoted by arrow 6010, a normal unit cell 2610 located at a cross point of the first row and the first main column of the first sub-array 210 may be replaced by the spare unit cell located at a cross point of the first row and the first spare column SC0 of the first sub-array 210. In addition, as denoted by arrow 6020, the first failed unit cell 2510 located at a cross point of the second row and the first main column of the first sub-array 210 may be replaced by the spare unit cell located at a cross point of the second row and the first spare column SC0 of the first sub-array 210. Moreover, as denoted by arrow 6030, the second failed unit cell 2520 located at a cross point of the third row and the first main column of the first sub-array 210 may be replaced by the spare unit cell located at a cross point of the third row and the first spare column SC0 of the first sub-array 210. Furthermore, as denoted by arrow 6040, the third failed unit cell 2530 located at a cross point of the fourth row and the first main column of the first sub-array 210 may be replaced by the spare unit cell located at a cross point of the fourth row and the first spare column SC0 of the first sub-array 210.

Similarly, the second main column having a column address of '1' among the main columns of the second sub-array 220 may also have three failed unit cells (i.e., the sixth to eighth failed unit cells 2560, 2570, and 2580). Because the number of failed unit cells included in the second main column of the second sub-array 220 is equal to the critical value of '3', the second main column of the second sub-array 220 may also be repaired in units of columns. Accordingly, all the main unit cells in the second main column of the second sub-array 220 may be replaced by all the spare unit cells in any one (e.g., the first spare column SC0) of the spare columns of the second sub-array 220. That is, as denoted by arrow 6050, a normal unit cell 2620 located at a cross point of the first row and the second main column of the second sub-array 220 may be replaced by the spare unit cell located at a cross point of the first row and the first spare column SC0 of the second sub-array 220. In addition, as denoted by arrow 6060, the sixth failed unit cell 2560 located at a cross point of the second row and the second main column of the second sub-array 220 may be replaced by the spare unit cell located at a cross point of the second row and the first spare column SC0 of the second sub-array 220. Moreover, as denoted by arrow 6070, the seventh failed unit cell 2570 located at a cross point of the third row and the second main column of the second sub-array 220 may be replaced by the spare unit cell located at a cross point of the third row and the first spare column SC0 of the second sub-array 220. Furthermore, as denoted by arrow 6080, the eighth failed unit cell 2580 located at a cross point of the fourth row and the second main column of the second sub-array 220 may be replaced by the spare unit cell located at a cross point of the fourth row and the first spare column SC0 of the second sub-array 220.

Figure 19:
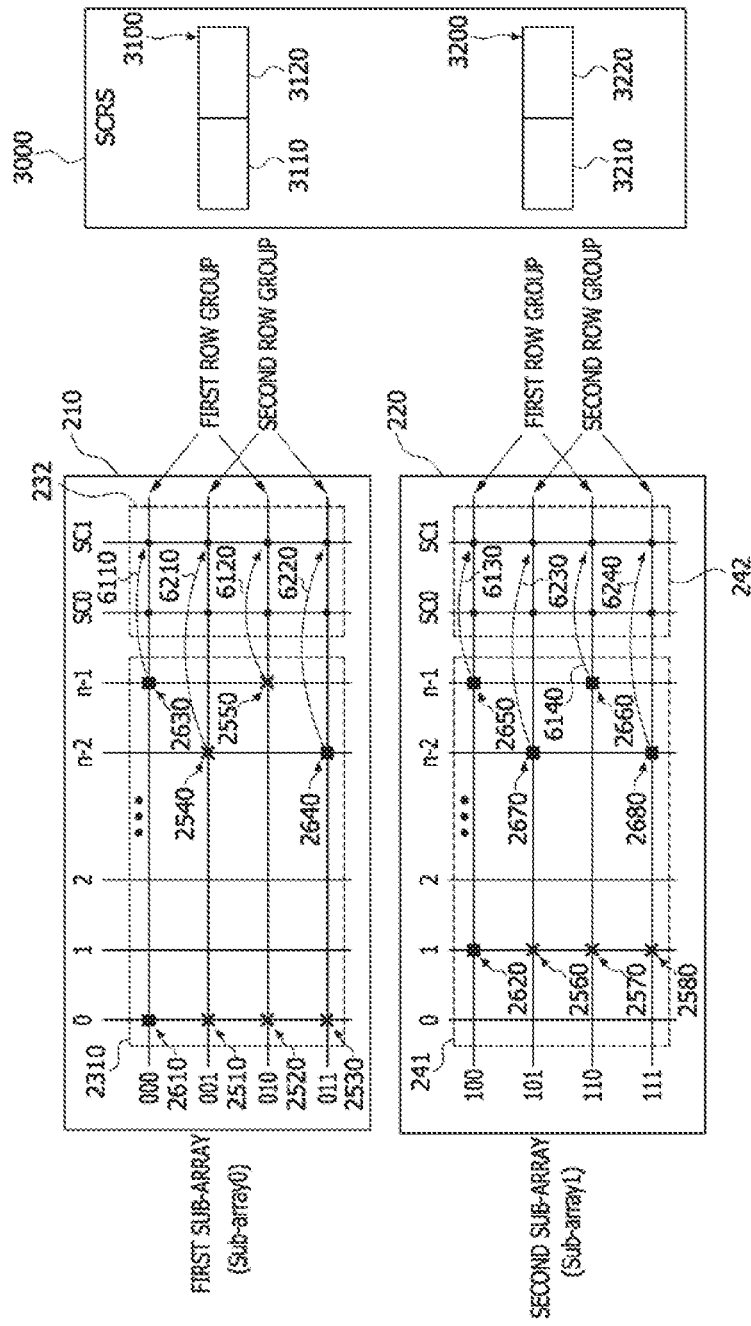

Next, as illustrated in FIG. 19, the $(N-1)^{th}$ main column having a column address of '(n−2)' among the main columns of the first sub-array 210 may have a single failed unit cell (i.e., the fourth failed unit cell 2540). Because the number of failed unit cells included in the $(N-1)^{th}$ main column of the first sub-array 210 is less than the critical value of '3', the $(N-1)^{th}$ main column of the first sub-array 210 may be repaired in units of row groups. Similarly, the $N^{th}$ main column having a column address of '(n−1)' among the main columns of the first sub-array 210 may have a single failed unit cell (i.e., the fifth failed unit cell 2550). Because the number of failed unit cells included in the $N^{th}$ main column of the first sub-array 210 is less than the critical value of '3', the $N^{th}$ main column of the first sub-array 210 may also be repaired in units of row groups.

The repair process performed in units of row groups may be executed in relation to the $N^{th}$ main column having the fifth failed unit cell 2550 belonging to the first row group. Specifically, the $N^{th}$ main column having the fifth failed unit cell 2550 belonging to the first row group may be replaced by the second spare column SC1 of the first sub-array 210. Because the $N^{th}$ main column having the fifth failed unit cell 2550 belonging to the first row group is repaired in units of row groups, all the main unit cells in the $N^{th}$ main column of the first sub-array 210 are not replaced by all the spare unit cells in the second spare column SC1 of the first sub-array 210. Accordingly, as denoted by arrows 6110 and 6120, a normal unit cell 2630 located at a cross point of the first row and the $N^{th}$ main column of the first sub-array 210 may be replaced by the spare unit cell located at a cross point of the first row and the second spare column SC1 of the first sub-array 210, and the fifth failed unit cell 2550 located at a cross point of the third row and the $N^{th}$ main column of the first sub-array 210 may be replaced by the spare unit cell located at a cross point of the third row and the second spare column SC1 of the first sub-array 210.

The repair process of the main unit cells in the first row group of the second sub-array 220 may be performed in the same manner as used in the repair process of the main unit cells in the first row group of the first sub-array 210. Thus, as denoted by arrow 6130, a normal unit cell 2650 located at a cross point of the first row and the $N^{th}$ main column of the second sub-array 220 may be replaced by the spare unit cell located at a cross point of the first row and the second spare column SC1 of the second sub-array 220. In addition, as denoted by arrow 6140, a normal unit cell 2660 located at a cross point of the third row and the $N^{th}$ main column of the second sub-array 220 may be replaced by the spare unit cell located at a cross point of the third row and the second spare column SC1 of the second sub-array 220.

After the main unit cells belonging to the first row group are repaired in units of row groups, the $(N-1)^{th}$ main column having the fourth failed unit cell 2540 belonging to the second row group may be repaired in units of row groups. Specifically, the $(N-1)^{th}$ main column having the fourth failed unit cell 2540 belonging to the second row group may be replaced by the second spare column SC1 of the first sub-array 210. Even in this case, since the $(N-1)^{th}$ main column having the fourth failed unit cell 2540 belonging to the second row group is repaired in units of row groups, all the main unit cells in the $(N-1)^{th}$ main column of the first sub-array 210 are not replaced by all the spare unit cells in the second spare column SC1 of the first sub-array 210.

Accordingly, as denoted by arrows 6210 and 6220, the fourth failed unit cell 2540 located at a cross point of the second row and the (N−1) main column of the first sub-array 210 may be replaced by the spare unit cell located at a cross point of the second row and the second spare column SC1 of the first sub-array 210, and a normal unit cell 2640 located at a cross point of the fourth row and the (N−1)$^{th}$ main column of the first sub-array 210 may be replaced by the spare unit cell located at a cross point of the fourth row and the second spare column SC1 of the first sub-array 210.

The repair process of the main unit cells in the second row group of the second sub-array 220 may be performed in the same manner as used in the repair process of the main unit cells in the second row group of the first sub-array 210. That is, as denoted by arrow 6230, a normal unit cell 2670 located at a cross point of the second row and the (N−1)$^{th}$ main column of the second sub-array 220 may be replaced by the spare unit cell located at a cross point of the second row and the second spare column SC1 of the second sub-array 220. In addition, as denoted by arrow 6240, a normal unit cell 2680 located at a cross point of the fourth row and the (N−1)$^{th}$ main column of the second sub-array 220 may be replaced by the spare unit cell located at a cross point of the fourth row and the second spare column SC1 of the second sub-array 220.

After the main columns including the failed unit cells are repaired, the process of remapping the column addresses of the repaired main columns may be performed using a spare column remap storage (SCRS) 3000. In an embodiment, the column address remapping process may be performed in relation to the main columns repaired in units of columns and may then be performed in relation to the main columns repaired in units of row groups. However, the remapping sequence may be set to be different according to the embodiments. For example, in some other embodiments, column addresses of the main columns repaired in units of columns may be remapped after column addresses of the main columns repaired in units of row groups are remapped.

Figure 20:
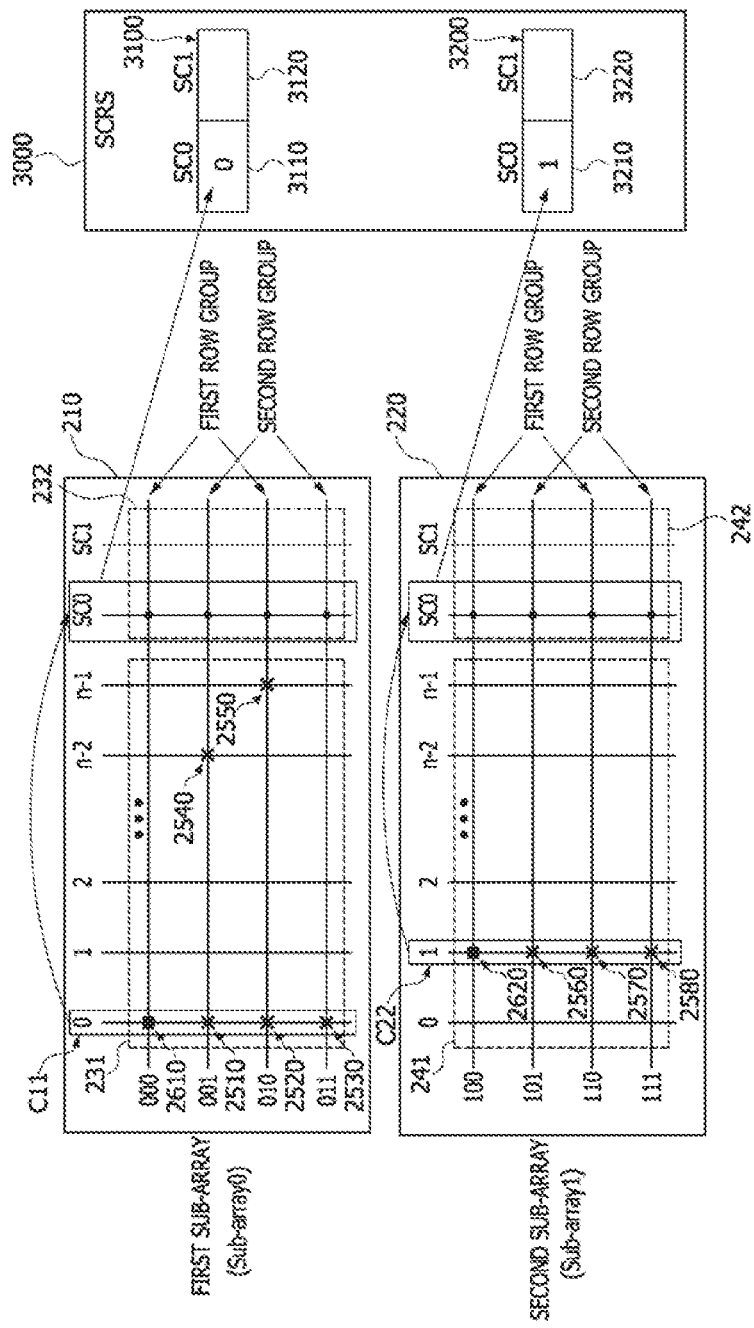

As illustrated in FIG. 20, a first address storage element 3110 of a first storage unit 3100 of the SCRS 3000 may be provided to store a column address of the first main column (C11) in the first sub-array 210, which is repaired in units of columns to be replaced by the first spare column SC0 in the first sub-array 210. In addition, a first address storage element 3210 of a second storage unit 3200 of the SCRS 3000 may be provided to store a column address of the second main column (C22) in the second sub-array 220, which is repaired in units of columns to be replaced by the first spare column SC0 in the second sub-array 220. Thus, the first address storage element 3110 of the first storage unit 3100 of the SCRS 3000 may be physically allocated to the first sub-array 210, and the first address storage element 3210 of the second storage unit 3200 of the SCRS 3000 may be physically allocated to the second sub-array 220.

As a result of the address remapping process of the main columns repaired in unit of columns, a value of '0' corresponding to a column address of the first main column (C11) replaced by the first spare column SC0 of the first sub-array 210 may be stored in the first address storage element 3110 of the first storage unit 3100 of the SCRS 3000. In addition, a value of '1' corresponding to a column address of the second main column (C22) replaced by the first spare column SC0 of the second sub-array 220 may be stored in the first address storage element 3210 of the second storage unit 3200 of the SCRS 3000.

A second address storage element 3120 of the first storage unit 3100 of the SCRS 3000 may be provided to store a column address of the main column having the main unit cells belonging to the first row group, which are repaired using the spare unit cells belonging to the first row group. A second address storage element 3220 of the second storage unit 3200 of the SCRS 3000 may be provided to store a column address of the main column having the main unit cells belonging to the second row group, which are repaired using the spare unit cells belonging to the second row group. Thus, the second address storage element 3120 of the first storage unit 3100 of the SCRS 3000 may be virtually allocated to the first row groups without distinction of the first and second sub-arrays 210 and 220, and the second address storage element 3220 of the second storage unit 3200 of the SCRS 3000 may be virtually allocated to the second row groups without distinction of the first and second sub-arrays 210 and 220.

Figure 21:
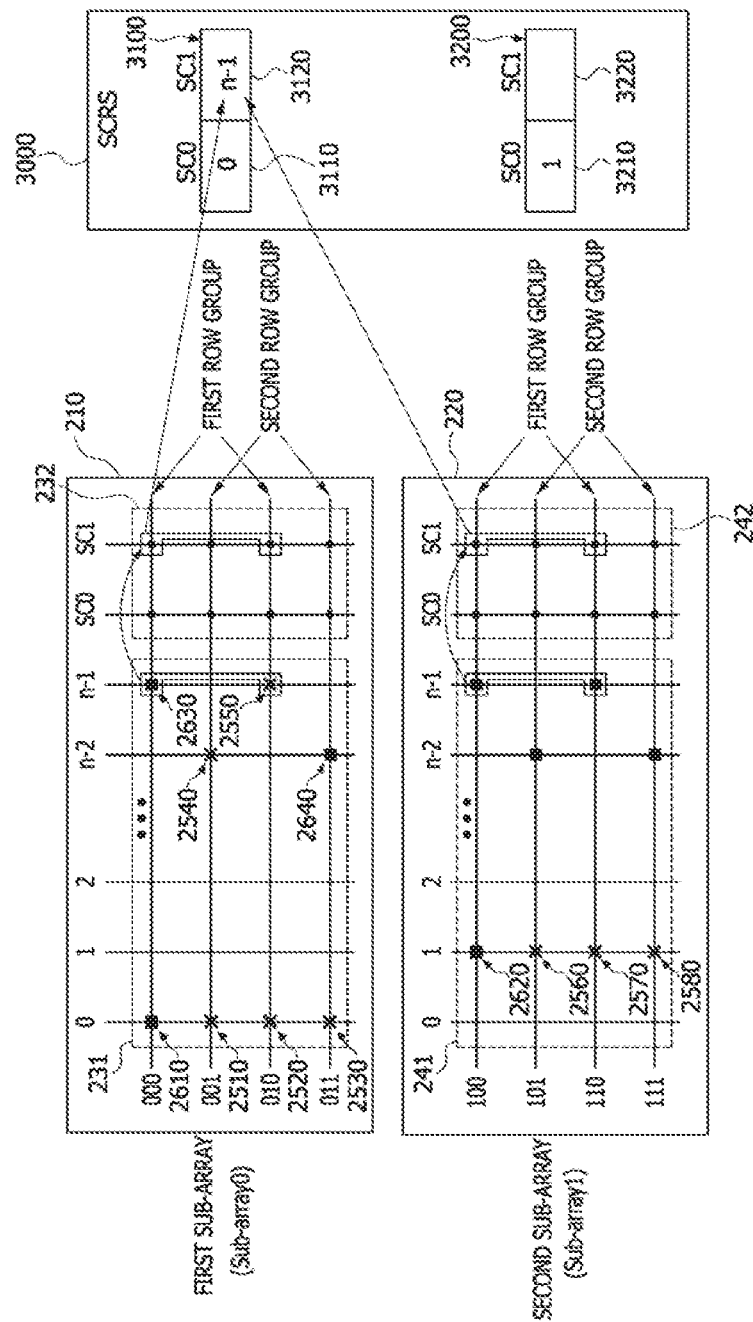

As illustrated in FIG. 21, a value of '(n−1)' corresponding to a column address of the N$^{th}$ main column including the main unit cells repaired in units of row groups using the spare unit cells of the first row group in the second spare column SC1 of the first sub-array 210 may be stored in the second address storage element 3120 of the first storage unit 3100 of the SCRS 3000. The column address '(n−1)' stored in the second address storage element 3120 of the first storage unit 3100 of the SCRS 3000 may also be consistent with the column address of the N$^{th}$ main column including the main unit cells repaired in units of row groups using the spare unit cells of the first row group in the second spare column SC1 of the second sub-array 220.

Figure 22:
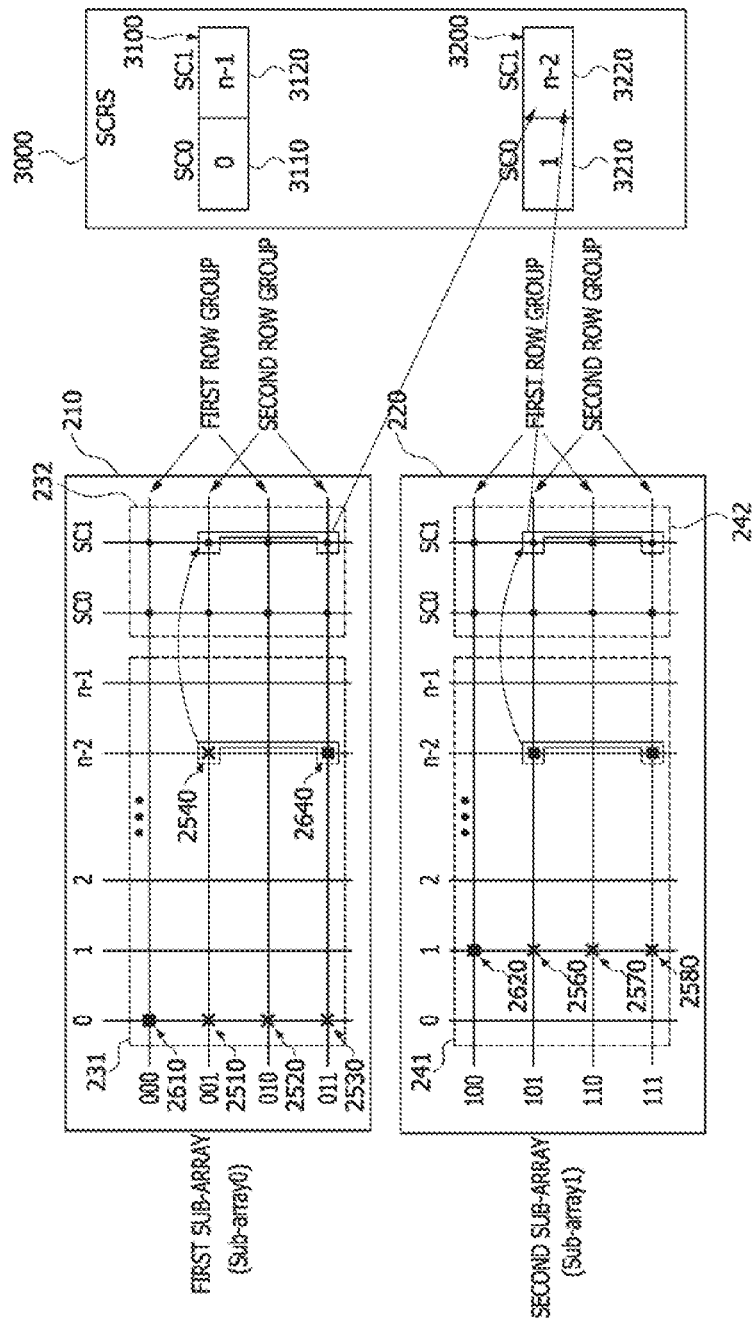

As illustrated in FIG. 22, a value of '(n−2)' corresponding to a column address of the (N−1)$^{th}$ main column including the main unit cells repaired in units of row groups using the spare unit cells of the second row group in the second spare column SC1 of the first sub-array 210 may be stored in the second address storage element 3220 of the second storage unit 3200 of the SCRS 3000. The column address '(n−2)' stored in the second address storage element 3220 of the second storage unit 3200 of the SCRS 3000 may also be consistent with the column address of the (N−1)$^{th}$ main column including the main unit cells repaired in units of row groups using the spare unit cells of the second row group in the second spare column SC1 of the second sub-array 220.

Figure 23:
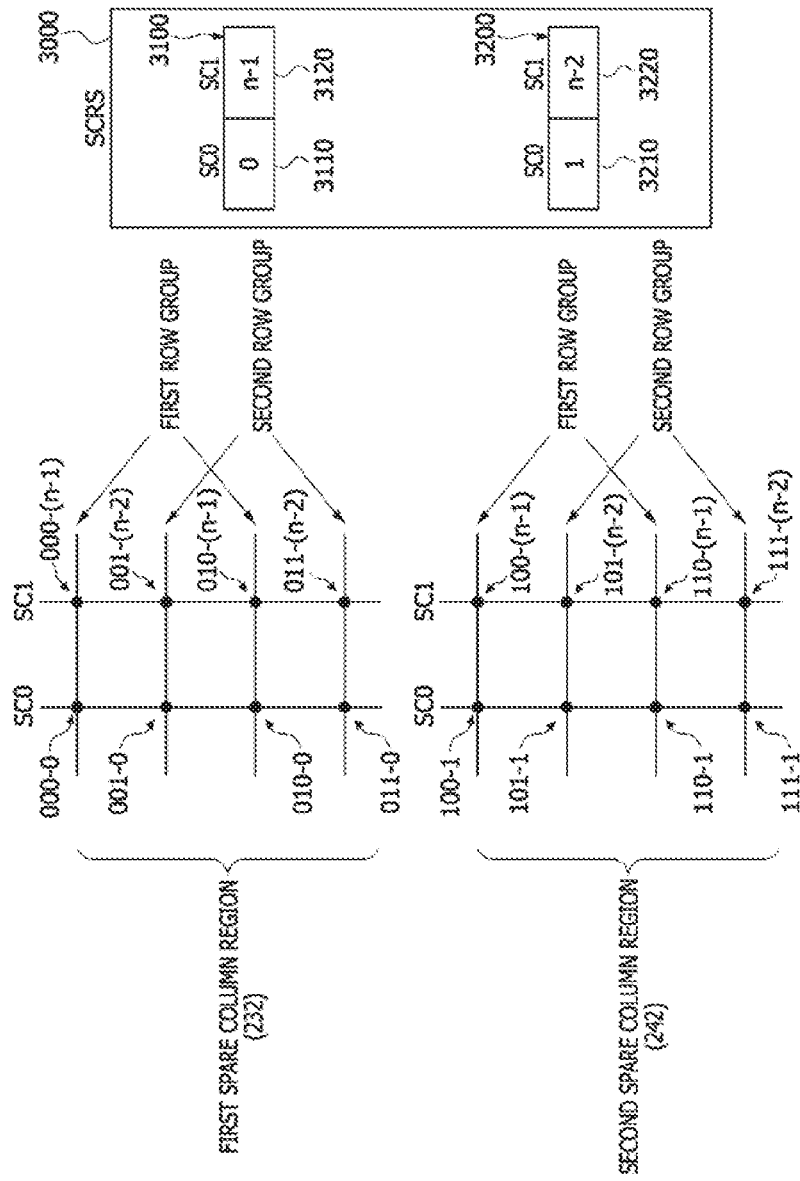
FIG. 23 is a schematic view illustrating a first spare column region and a second spare column region together with a spare column remap storage, which are repaired in units of columns and in units of row groups according to the embodiment described with reference to FIGS. 17 to 22.

FIG. 23 is a schematic view illustrating the first and second spare column regions 232 and 242 and the spare column remap storage 3000 which are repaired and remapped according to the embodiment described with reference to FIGS. 17 to 22. Referring to FIG. 23, the first address storage element 3110 of the first storage unit 3100 of the SCRS 3000 may be provided to store a column address information of a main column in the first sub-array 210 repaired in units of columns using the first spare column SC0 in the first spare column region 232. That a column address of '0' is stored in the first address storage element 3110 of the first storage unit 3100 of the SCRS 3000 may mean that all the main unit cells in the first main column (having a column address of '0') of the first sub-array 210 are replaced by all the spare unit cells in the first spare column SC0 of the first sub-array 210. That is, the spare unit cells in the first spare column SC0 of the first spare column region 232 may have a row address of '000' and a column address of '0', a row address of '001' and a column address of '0', a row address of '010' and a column address of '0', and a row address of '011' and a column address of '0', respectively. Accordingly, if a read command for selectively reading out a datum stored in any one of the main unit cells designated by a column address of '0', for example, a read command for reading out a datum stored in the main unit cell selected by a row address of '010' and a column address of '0' is generated, a datum stored in the spare unit cell having a row address of '010' among the spare unit cells in the first spare column SC0 of the first spare column region 232 (instead of a datum stored in the main unit cell disposed at a position denoted by a row address of '010' and a column address of '0') may be read out based on the column address information of '0' stored in the first address storage element 3110 of the first storage unit 3100 of the SCRS 3000.

The first address storage element 3210 of the second storage unit 3200 of the SCRS 3000 may be provided to store a column address information of a main column in the second sub-array 220 repaired in units of columns using the first spare column SC0 in the second spare column region 242. That a column address of '1' is stored in the first address storage element 3210 of the second storage unit 3200 of the SCRS 3000 may mean that all the main unit cells in the second main column (having a column address of '1') of the second sub-array 220 are replaced by all the spare unit cells in the first spare column SC0 of the second sub-array 220. That is, the spare unit cells in the first spare column SC0 of the second spare column region 242 may have a row address of '100' and a column address of '1', a row address of '101' and a column address of '1', a row address of '110' and a column address of '1', and a row address of '111' and a column address of '1', respectively. Accordingly, if a read command for selectively reading out a datum stored in any one of the main unit cells designated by a column address of '1', for example, a read command for reading out a datum stored in the main unit cell selected by a row address of '110' and a column address of '1' is generated, a datum stored in the spare unit cell having a row address of '110' among the spare unit cells in the first spare column SC0 of the second spare column region 242 (instead of a datum stored in the main unit cell disposed at a position denoted by a row address of '110' and a column address of '1') may be read out based on the column address information of '1' stored in the first address storage element 3210 of the second storage unit 3200 of the SCRS 3000.

The second address storage element 3120 of the first storage unit 3100 of the SCRS 3000 and the second address storage element 3220 of the second storage unit 3200 of the SCRS 3000 may be provided to store column address information of main columns in the sub-arrays 210 and 220 repaired in units of row groups using the second spare columns SC1 in the first and second spare column regions 232 and 242. For example, the second address storage element 3120 of the first storage unit 3100 of the SCRS 3000 may be provided to store column address information of a main column repaired using the spare unit cells belonging to the first row group in the second spare columns SC1 of the first and second spare column regions 232 and 242, and the second address storage element 3220 of the second storage unit 3200 of the SCRS 3000 may be provided to store column address information of a main column repaired using the spare unit cells belonging to the second row group in the second spare columns SC1 of the first and second spare column regions 232 and 242.

Specifically, that a column address of '(n−1)' is stored in the second address storage element 3120 of the first storage unit 3100 of the SCRS 300 may mean that the main unit cells belonging to the first row group (i.e., the main unit cells in the first row and the third row of the $N^{th}$ main column) among the main unit cells in the $N^{th}$ main column (having a column address of '(n−1)') of the first and second sub-arrays 210 and 220 are replaced by the spare unit cells belonging to the first row groups in the second spare columns SC1 of the first and second spare column regions 232 and 242. That is, the spare unit cells belonging to the first row group in the second spare column SC1 of the first spare column region 232 may have a row address of '000' and a column address of '(n−1)' as well as a row address of '010' and a column address of '(n−1)', respectively. Similarly, the spare unit cells belonging to the first row group in the second spare column SC1 of the second spare column region 242 may have a row address of '100' and a column address of '(n−1)' as well as a row address of '110' and a column address of '(n−1)', respectively.

Accordingly, if a read command for selectively reading out a datum stored in any one of the main unit cells belonging to the first row group designated by a column address of '(n−1)' in the first sub-array 210, for example, a read command for reading out a datum stored in the main unit cell selected by a row address of '010' and a column address of '(n−1)' is generated, a datum stored in the spare unit cell having a row address of '010' among the spare unit cells in the second spare column SC1 of the first spare column region 232 (instead of a datum stored in the main unit cell disposed at a position denoted by a row address of '010' and a column address of '(n−1)') may be read out based on the column address information of '(n−1)' stored in the second address storage element 3120 of the first storage unit 3100 of the SCRS 3000. In addition, if a read command for selectively reading out a datum stored in any one of the main unit cells belonging to the first row group designated by a column address of '(n−1)' in the second sub-array 220, for example, a read command for reading out a datum stored in the main unit cell selected by a row address of '110' and a column address of '(n−1)' is generated, a datum stored in the spare unit cell having a row address of '110' among the spare unit cells in the second spare column SC1 of the second spare column region 242 (instead of a datum stored in the main unit cell disposed at a position denoted by a row address of '110' and a column address of '(n−1)') may be read out based on the column address information of '(n−1)' stored in the second address storage element 3120 of the first storage unit 3100 of the SCRS 3000.

Similarly, that a column address of '(n−2)' is stored in the second address storage element 3220 of the second storage unit 3200 of the SCRS 300 may mean that the main unit cells belonging to the second row group (i.e., the main unit cells in the second row and the fourth row of the $(N-1)^{th}$ main column) among the main unit cells in the $(N-1)^{th}$ main column (having a column address of '(n−2)') of the first and second sub-arrays 210 and 220 are replaced by the spare unit cells belonging to the second row groups in the second spare columns SC1 of the first and second spare column regions 232 and 242. That is, the spare unit cells belonging to the second row group in the second spare column SC1 of the first spare column region 232 may have a row address of '001' and a column address of '(n−2)' as well as a row address of '011' and a column address of '(n−2)', respectively. Similarly, the spare unit cells belonging to the second row group in the second spare column SC1 of the second spare column region 242 may have a row address of '101' and a column address of '(n−2)' as well as a row address of '111' and a column address of '(n−2)', respectively.

Accordingly, if a read command for selectively reading out a datum stored in any one of the main unit cells belonging to the second row group designated by a column address of '(n−2)' in the first sub-array 210, for example, a read command for reading out a datum stored in the main unit cell selected by a row address of '011' and a column address of '(n−2)' is generated, a datum stored in the spare unit cell having a row address of '011' among the spare unit cells in the second spare column SC1 of the first spare column region 232 (instead of a datum stored in the main unit cell disposed at a position denoted by a row address of '011' and a column address of '(n−2)') may be read out based on the column address information of '(n−2)' stored in the second address storage element 3220 of the second storage unit 3200 of the SCRS 3000. In addition, if a read command for selectively reading out a datum stored in any one of the main unit cells belonging to the second row group designated by a column address of '(n−2)' in the second sub-array 220, for example, a read command for reading out a datum stored in the main unit cell selected by a row address of '111' and a column address of '(n−2)' is generated, a datum stored in the spare unit cell having a row address of '111' among the spare unit cells in the second spare column SC1 of the second spare column region 242 (instead of a datum stored in the main unit cell disposed at a position denoted by a row address of '111' and a column address of '(n−2)') may be read out based on the column address information of '(n−2)' stored in the second address storage element 3220 of the second storage unit 3200 of the SCRS 3000.

FIGS. 24 to 30 are schematic views illustrating in detail the hybrid repair process and the address remapping process relating to the hybrid repair process, which are described with reference to FIG. 16. In FIGS. 24 to 30, the same reference numerals as used in FIGS. 1 and 2 denote the same elements. The present embodiments will also be described hereinafter in conjunction with an example in which the memory device 100 includes the first sub-array 210 and the second sub-array 220. However, a column address remapping process described in the present embodiment may be equally applicable to other memory devices including three or more sub-arrays.

Figure 24:
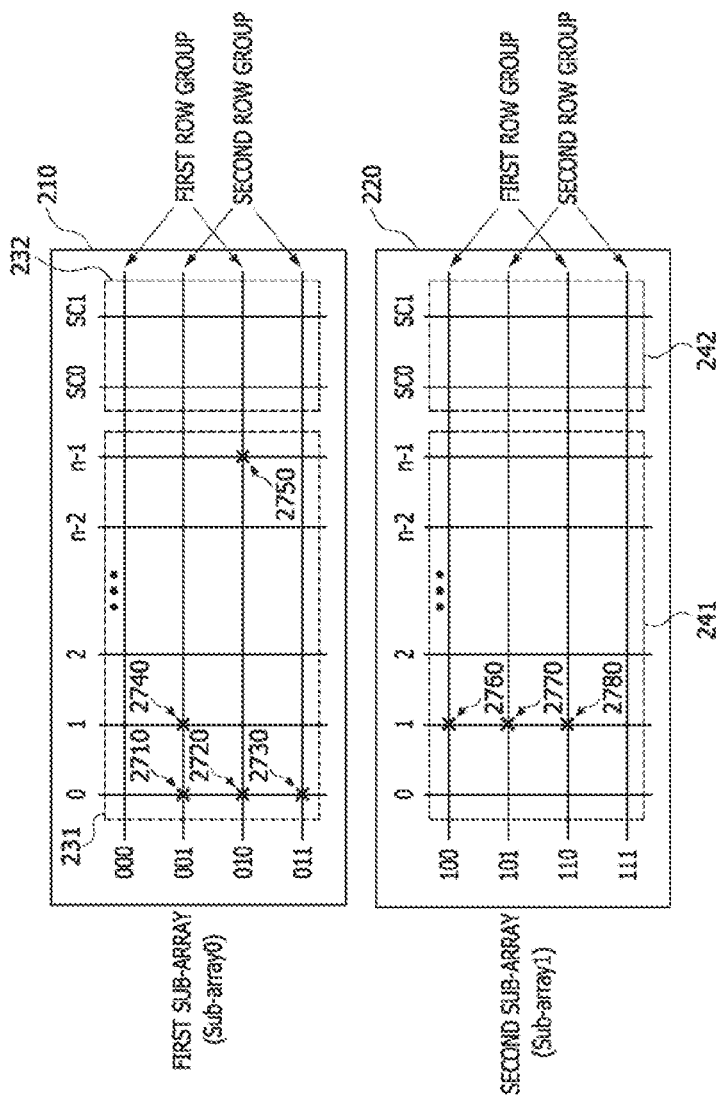
FIGS. 24 to 30 are schematic views illustrating in detail a method of remapping column addresses with a spare column remap storage in a repair process of a memory device according to yet another embodiment of the present disclosure.

Referring to FIG. 24, the main unit cells in the first main column region 231 of the first sub-array 210 and the main unit cells in the second main column region 241 of the second sub-array 220 may be tested to obtain distribution of failed unit cells. As indicated by symbols "x" in FIG. 24, it is assumed that the memory device 100 according to the present embodiment includes first to eighth failed unit cells 2710, 2720, 2730, 2740, 2750, 2760, 2770, and 2780. For example, the first failed unit cell 2710 may be located at a cross point of the second row and the first main column (having a column address of '0') in the first main column region 231, the second failed unit cell 2720 may be located at a cross point of the third row and the first main column in the first main column region 231, the third failed unit cell 2730 may be located at a cross point of the fourth row and the first main column in the first main column region 231, the fourth failed unit cell 2740 may be located at a cross point of the second row and the second main column (having a column address of '1') in the first main column region 231, and the fifth failed unit cell 2750 may be located at a cross point of the third row and the $N^{th}$ main column (having a column address of '(n−1)') in the first main column region 231. In addition, the sixth failed unit cell 2760 may be located at a cross point of the first row and the second main column in the second main column region 241, the seventh failed unit cell 2770 may be located at a cross point of the second row and the second main column in the second main column region 241, and the eighth failed unit cell 2780 may be located at a cross point of the third row and the second main column in the second main column region 241. The remaining main unit cells except for the first to eighth failed unit cells 2710~2780 may be regarded as normal unit cells.

After distribution of the failed unit cells is obtained, a repair process and a column address remapping process relating to the repair process may be performed. In order to perform the repair process and the column address remapping process, the rows in the first sub-array 210 may be categorized as either a first row group or a second row group. Similarly, the rows in the second sub-array 220 may be categorized as either the first row group or the second row group. The rows in the first and second sub-arrays 210 and 220 may be classified as the first row group or the second row group using any one of various methods according to the distribution of the failed unit cells included in each of the rows. In the present embodiment, the first row group may include odd-numbered rows among the rows in the first sub-array 210 and the second sub-array 220, and the second row group may include even-numbered rows among the rows in the first sub-array 210 and the second sub-array 220.

According to the present embodiment, the first row having a row address of '000' and the third row having a row address of '010' in the first sub-array 210 may be allocated to the first row group, and the first row having a row address of '100' and the third row having a row address of '110' in the second sub-array 220 may be allocated to the first row group. In addition, the second row having a row address of '001' and the fourth row having a row address of '011' in the first sub-array 210 may be allocated to the second row group, and the second row having a row address of '101' and the fourth row having a row address of '111' in the second sub-array 220 may be allocated to the second row group.

In the present embodiment, row addresses of the rows belonging to the first row groups in the first and second sub-arrays 210 and 220 may have a third bit (i.e., an LSB) of '0' in common, and row addresses of the rows belonging to the second row groups in the first and second sub-arrays 210 and 220 may have a third bit (i.e., an LSB) of '1' in common. In addition, row addresses of the rows belonging to the first and second row groups in the first sub-array 210 may have a first bit (i.e., MSB) of '0' in common, and row addresses of the rows belonging to the first and second row groups in the second sub-array 220 may have a first bit (i.e., MSB) of '1' in common.

After distribution of the failed unit cells is obtained and the first and second row groups are defined, the repair processes of the failed unit cells may be performed as described with reference to the steps 4530 and 4540 in FIG. 16. In such a case, the repair processes may be performed by a hybrid repair process. The hybrid repair process may include repair processes performed in units of columns and repair processes performed in units of row groups. Specifically, the repair processes performed in units of columns may be executed in relation to the main columns including the failed unit cells, the number of which is greater than or equal to or a critical value in each main column. In contrast, the repair processes performed in units of row groups may be executed in relation to the main columns including the failed unit cells, the number of which is less than the critical value in each main column. If the number of rows in each sub-array is "L" and the number of spare columns in each sub-array is "S", the critical value may be set to be a natural number which is greater than "L÷S" as described with reference to FIG. 4. In the present embodiment, since the number "L" of rows in each sub-array is four and the number "S" of spare columns in each sub-array is two, the critical value may be set to be a natural number which is greater than two. That is, the critical value may be set to be three.

If the critical value is three, the first main column having three failed unit cells (i.e., the first to third failed unit cells 2710, 2720, and 2730) among the main columns of the first sub-array 210 may be repaired in units of columns, and the second main column having three failed unit cells (i.e., the sixth to eighth failed unit cells 2760, 2770, and 2780) among the main columns of the second sub-array 220 may also be repaired in units of columns. In contrast, the main columns, each of which has two or less failed unit cells, may be repaired in units of row groups. That is, the second main column (having a column address of '1') having one failed unit cell (i.e., the fourth failed unit cell 2740) among the main columns of the first sub-array 210 may be repaired in units of row groups, and the $N^{th}$ main column (having a column address of '(n−1)') having one failed unit cell (i.e., the fifth failed unit cell 2750) among the main columns of the first sub-array 210 may also be repaired in units of row groups.

Figure 25:
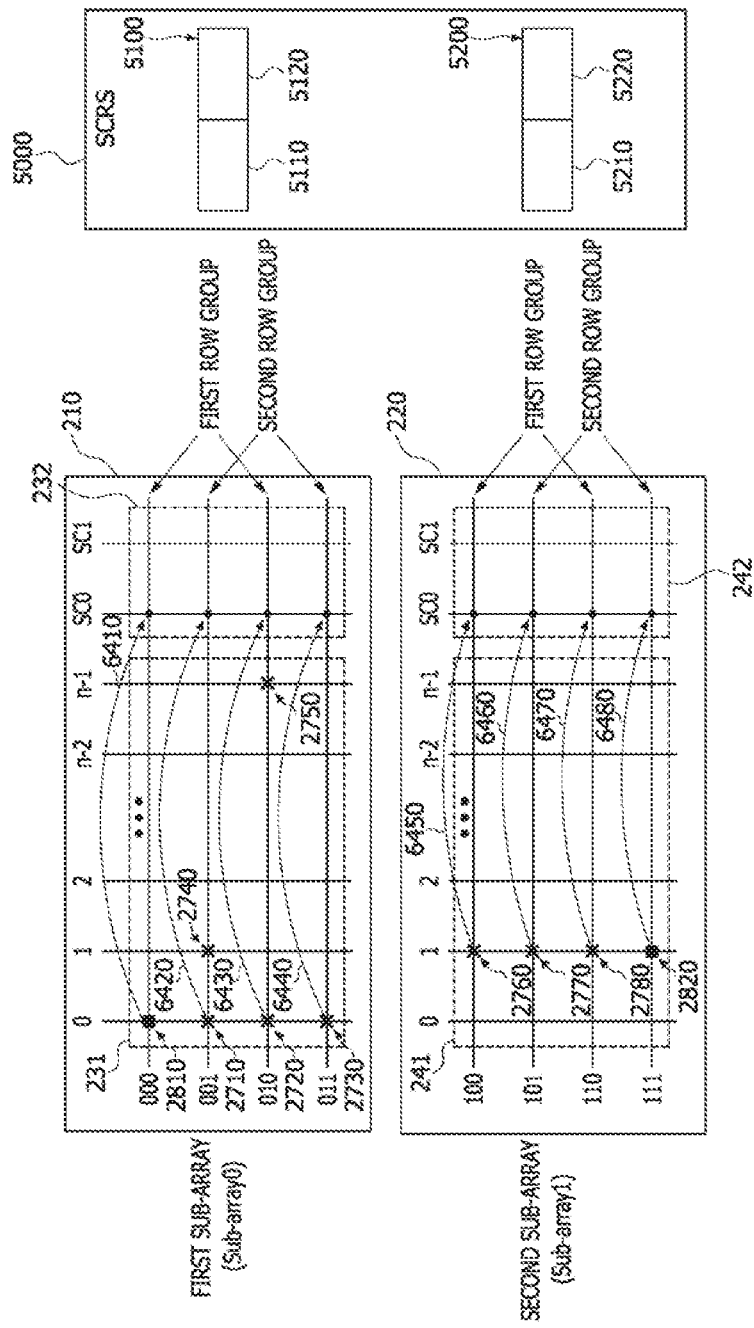

Hereinafter, the repair processes and the column address remapping processes in relation to the first to eighth failed unit cells 2710~2780 will be described in detail with reference to FIGS. 25 to 30. First, as illustrated in FIG. 25, the first main column having a column address of '0' among the main columns of the first sub-array 210 may have three failed unit cells (i.e., the first to third failed unit cells 2710, 2720, and 2730). Because the number of failed unit cells included in the first main column of the first sub-array 210 is equal to the critical value of '3', the first main column of the first sub-array 210 may be repaired in units of columns. Accordingly, all the main unit cells in the first main column of the first sub-array 210 may be replaced by all the spare unit cells in any one (e.g., the first spare column SC0) of the spare columns of the first sub-array 210. That is, as denoted by arrow 6410, a normal unit cell 2810 located at a cross point of the first row and the first main column of the first sub-array 210 may be replaced by the spare unit cell located at a cross point of the first row and the first spare column SC0 of the first sub-array 210. In addition, as denoted by arrow 6420, the first failed unit cell 2710 located at a cross point of the second row and the first main column of the first sub-array 210 may be replaced by the spare unit cell located at a cross point of the second row and the first spare column SC0 of the first sub-array 210. Moreover, as denoted by arrow 6430, the second failed unit cell 2720 located at a cross point of the third row and the first main column of the first sub-array 210 may be replaced by the spare unit cell located at a cross point of the third row and the first spare column SC0 of the first sub-array 210. Furthermore, as denoted by arrow 6440, the third failed unit cell 2730 located at a cross point of the fourth row and the first main column of the first sub-array 210 may be replaced by the spare unit cell located at a cross point of the fourth row and the first spare column SC0 of the first sub-array 210.

Similarly, the second main column having a column address of '1' among the main columns of the second sub-array 220 may also have three failed unit cells (i.e., the sixth to eighth failed unit cells 2760, 2770, and 2780). Because the number of failed unit cells included in the second main column of the second sub-array 220 is equal to the critical value of '3', the second main column of the second sub-array 220 may also be repaired in units of columns. Accordingly, all the main unit cells in the second main column of the second sub-array 220 may be replaced by all the spare unit cells in any one (e.g., the first spare column SC0) of the spare columns of the second sub-array 220. That is, as denoted by arrow 6450, the sixth unit cell 2760 located at a cross point of the first row and the second main column of the second sub-array 220 may be replaced by the spare unit cell located at a cross point of the first row and the first spare column SC0 of the second sub-array 220. In addition, as denoted by arrow 6460, the seventh failed unit cell 2770 located at a cross point of the second row and the second main column of the second sub-array 220 may be replaced by the spare unit cell located at a cross point of the second row and the first spare column SC0 of the second sub-array 220. Moreover, as denoted by arrow 6470, the eighth failed unit cell 2780 located at a cross point of the third row and the second main column of the second sub-array 220 may be replaced by the spare unit cell located at a cross point of the third row and the first spare column SC0 of the second sub-array 220. Furthermore, as denoted by arrow 6480, a normal unit cell 2820 located at a cross point of the fourth row and the second main column of the second sub-array 220 may be replaced by the spare unit cell located at a cross point of the fourth row and the first spare column SC0 of the second sub-array 220.

Figure 26:
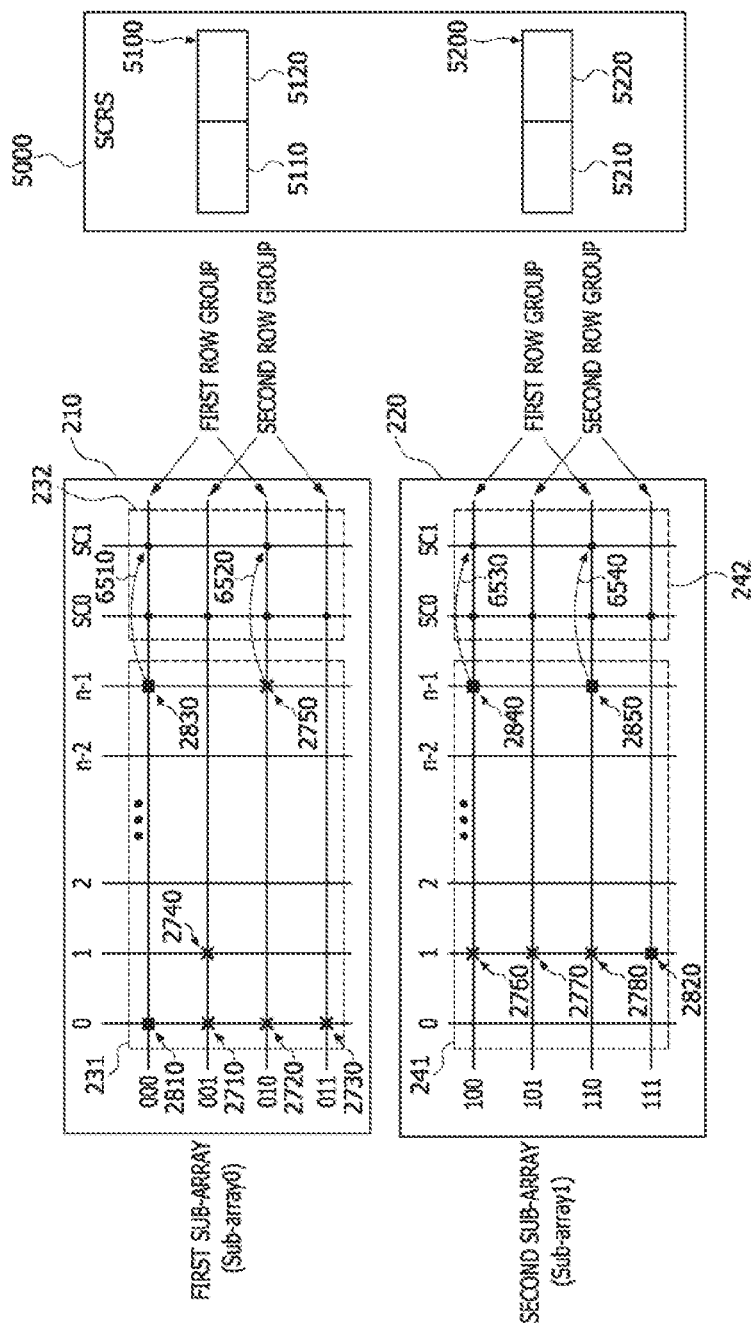

Referring to FIG. 26, the second main column having a column address of '1' among the main columns of the first sub-array 210 may have a single failed unit cells (i.e., the fourth failed unit cell 2740). Because the number of failed unit cells included in the second main column of the first sub-array 210 is less than the critical value of '3', the second main column of the first sub-array 210 may be repaired in units of row groups. Similarly, the $N^{th}$ main column having a column address of '(n−1)' among the main columns of the first sub-array 210 may also have a single failed unit cells (i.e., the fifth failed unit cell 2750). Because the number of failed unit cells included in the $N^{th}$ main column of the first sub-array 210 is less than the critical value of '3', the $N^{th}$ main column of the first sub-array 210 may also be repaired in units of row groups.

First, the repair process performed in units of row groups may be executed in relation to the $N^{th}$ main column having the fifth failed unit cell 2750 belonging to the first row group. Specifically, the $N^{th}$ main column having the fifth failed unit cell 2750 belonging to the first row group may be repaired using the second spare column SC1 of the first sub-array 210. Since the $N^{th}$ main column having the fifth failed unit cell 2750 belonging to the first row group is repaired in units of row groups, all the main unit cells in the $N^{th}$ main column of the first sub-array 210 are not replaced by all the spare unit cells in the second spare column SC1 of the first sub-array 210. Accordingly, as denoted by arrows 6510 and 6520, a normal unit cell 2830 located at a cross point of the first row and the $N^{th}$ main column of the first sub-array 210 may be replaced by the spare unit cell located at a cross point of the first row and the second spare column SC1 of the first sub-array 210, and the fifth failed unit cell 2750 located at a cross point of the third row and the $N^{th}$ main column of the first sub-array 210 may be replaced by the spare unit cell located at a cross point of the third row and the second spare column SC1 of the first sub-array 210.

The repair process of the main unit cells belonging to the first row group of the second sub-array 220 may be performed in the same manner as used in the repair process of the main unit cells belonging to the first row group of the first sub-array 210. Thus, as denoted by arrow 6530, a normal unit cell 2840 located at a cross point of the first row and the $N^{th}$ main column of the second sub-array 220 may be replaced by the spare unit cell located at a cross point of the first row and the second spare column SC1 of the second sub-array 220. In addition, as denoted by arrow 6540, a normal unit cell 2850 located at a cross point of the third row and the $N^{th}$ main column of the second sub-array 220 may be replaced by the spare unit cell located at a cross point of the third row and the second spare column SC1 of the second sub-array 220.

Figure 27:
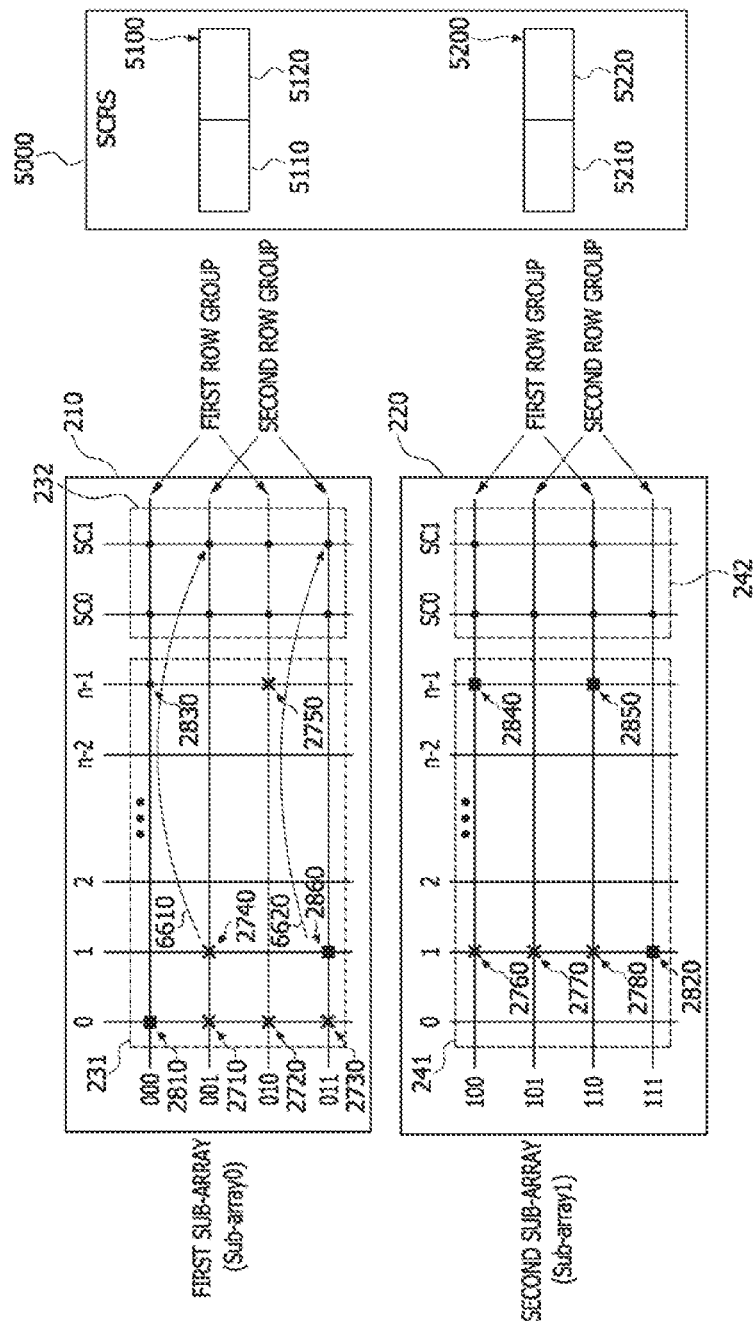

Referring to FIG. 27, after the failed unit cells belonging to the first row group are repaired in units of row groups, the second main column having the fourth failed unit cell 2740 belonging to the second row group may be repaired in units of row groups. Specifically, the second main column having the fourth failed unit cell 2740 belonging to the second row group may be repaired using the second spare column SC1 of the first sub-array 210. Even in this case, since the second main column having the fourth failed unit cell 2740 belonging to the second row group is repaired in units of row groups, all the main unit cells in the second main column of the first sub-array 210 are not replaced by all the spare unit cells in the second spare column SC1 of the first sub-array 210. Accordingly, as denoted by arrows 6610 and 6620, the fourth failed unit cell 2740 located at a cross point of the second row and the second main column of the first sub-array 210 may be replaced by the spare unit cell located at a cross point of the second row and the second spare column SC1 of the first sub-array 210, and a normal unit cell 2860 located at a cross point of the fourth row and the second main column of the first sub-array 210 may be replaced by the spare unit cell located at a cross point of the fourth row and the second spare column SC1 of the first sub-array 210.

The repair process of the main unit cells belonging to the second row group of the second sub-array 220 may be performed in the same manner as used in the repair process of the main unit cells belonging to the second row group of the first sub-array 210. However, in the present embodiment, the second main column (having a column address of '1') of the second sub-array 220 has been already repaired in units of columns using the first spare column SC0 of the second sub-array 220. Thus, the repair process of the main unit cells belonging to the second row group in the second main column of the second sub-array 220 may be omitted.

After the main columns including the failed unit cells are repaired, the process of remapping the column addresses of the repaired main columns may be performed using a spare column remap storage (SCRS) 5000. In an embodiment, the column address remapping process may be performed in relation to the main columns repaired in units of columns and may then be performed in relation to the main columns repaired in units of row groups. However, the remapping sequence may be set to be different according to the embodiments. For example, in some other embodiments, column addresses of the main columns repaired in units of columns may be remapped after column addresses of the main columns repaired in units of row groups are remapped.

Figure 28:
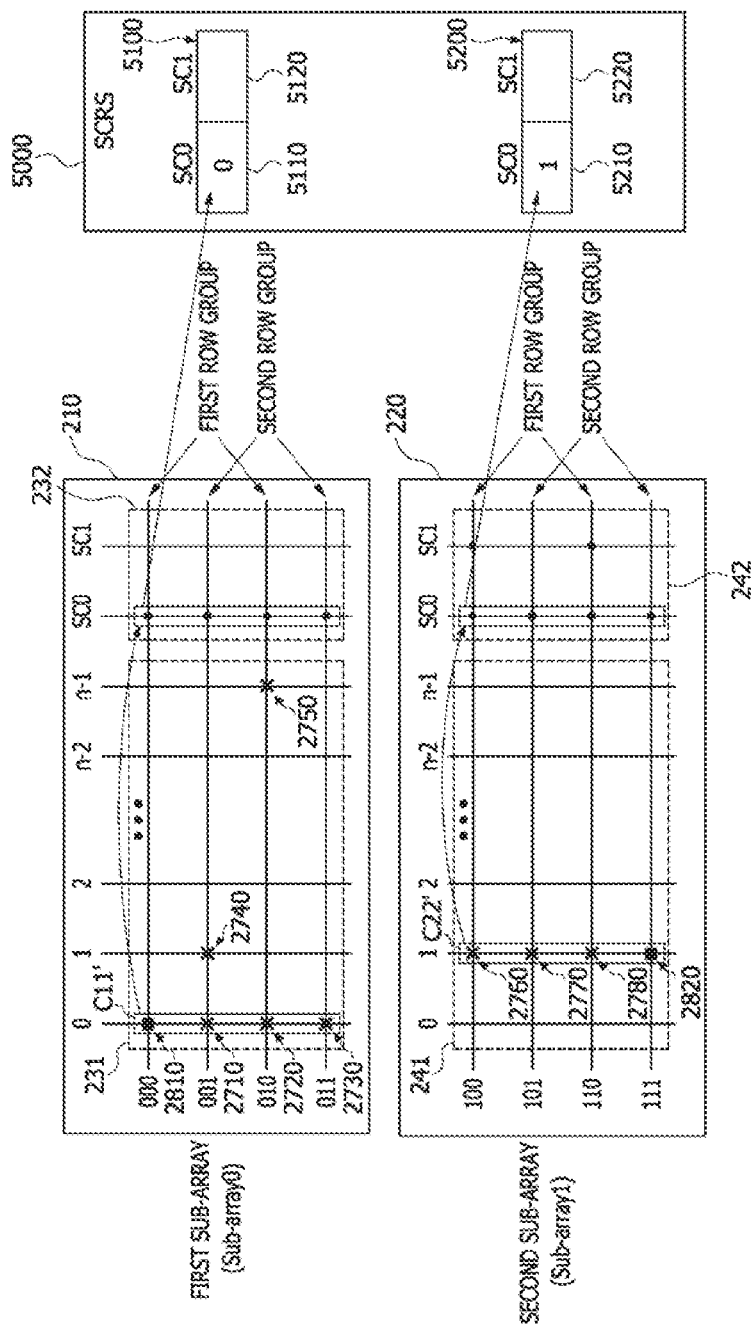

As illustrated in FIG. 28, a first address storage element 5110 of a first storage unit 5100 of the SCRS 5000 may be provided to store a column address of the first main column (C11') in the first sub-array 210, which is repaired in units of columns to be replaced by the first spare column SC0 in the first sub-array 210. In addition, a first address storage element 5210 of a second storage unit 5200 of the SCRS 3000 may be provided to store a column address of the second main column (C22') in the second sub-array 220, which is repaired in units of columns to be replaced by the first spare column SC0 in the second sub-array 220. Thus, the first address storage element 5110 of the first storage unit 5100 of the SCRS 5000 may be physically allocated to the first sub-array 210, and the first address storage element 5210 of the second storage unit 5200 of the SCRS 3000 may be physically allocated to the second sub-array 220.

As a result of the address remapping process of the main columns repaired in unit of columns, a value of '0' corresponding to a column address of the first main column (C11') replaced by the first spare column SC0 of the first sub-array 210 may be stored in the first address storage element 5110 of the first storage unit 5100 of the SCRS 5000. In addition, a value of '1' corresponding to a column address of the second main column (C22') replaced by the first spare column SC0 of the second sub-array 220 may be stored in the first address storage element 5210 of the second storage unit 5200 of the SCRS 5000.

After the address remapping process of the main columns repaired in unit of columns is performed, the address remapping process of the main columns repaired in unit of row groups may be performed. In order to perform the address remapping process of the main columns repaired in unit of row groups, a second address storage element 5120 of the first storage unit 5100 of the SCRS 5000 may be provided to store a column address of the main column having the main unit cells belonging to the first row group, which are repaired using the spare unit cells belonging to the first row group. A second address storage element 5220 of the second storage unit 5200 of the SCRS 5000 may be provided to store a column address of the main column having the main unit cells belonging to the second row group, which are repaired using the spare unit cells belonging to the second row group. Thus, the second address storage element 5120 of the first storage unit 5100 of the SCRS 5000 may be virtually allocated to the first row groups without distinction of the first and second sub-arrays 210 and 220, and the second address storage element 5220 of the second storage unit 5200 of the SCRS 5000 may be virtually allocated to the second row groups without distinction of the first and second sub-arrays 210 and 220.

Figure 29:
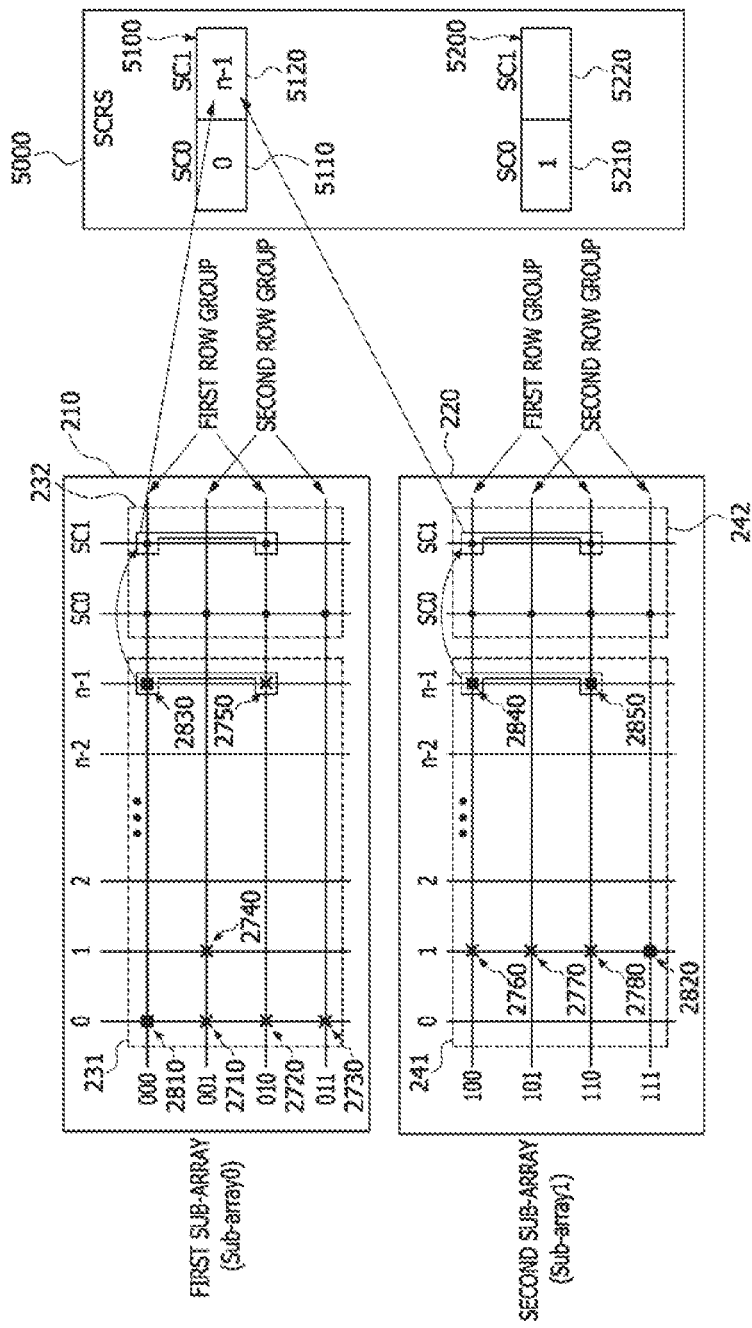

As illustrated in FIG. 29, a value of '(n−1)' corresponding to a column address of the $N^{th}$ main column including the main unit cells repaired in units of row groups using the spare unit cells of the first row group in the second spare column SC1 of the first sub-array 210 may be stored in the second address storage element 5120 of the first storage unit 5100 of the SCRS 5000. The column address '(n−1)' stored in the second address storage element 5120 of the first storage unit 5100 of the SCRS 5000 may also be consistent with the column address of the $N^{th}$ main column including the main unit cells repaired in units of row groups using the spare unit cells of the first row group in the second spare column SC1 of the second sub-array 220.

Figure 30:
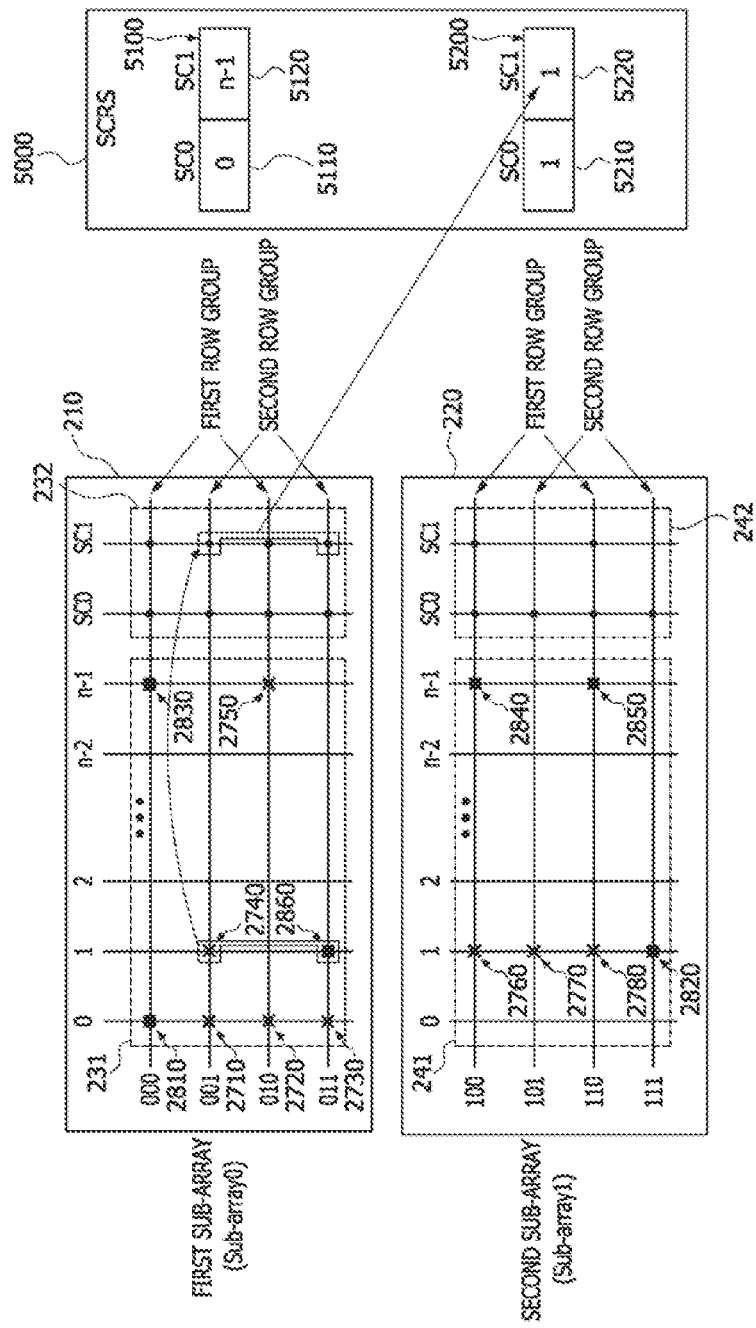

As illustrated in FIG. 30, a value of '1' corresponding to a column address of the second main column including the main unit cells repaired in units of row groups using the spare unit cells of the second row group in the second spare column SC1 of the first sub-array 210 may be stored in the second address storage element 5220 of the second storage unit 5200 of the SCRS 5000. Since the second main column (having a column address of '1') of the second sub-array 220 is not repaired in units of row groups, the address remapping process for the second main column of the second sub-array 220 may possibly not be performed.

FIG. 31 is a schematic view illustrating the first and second spare column regions 232 and 242 and the spare column remap storage 5000 which are repaired and remapped according to the embodiment described with reference to FIGS. 24 to 30. Referring to FIG. 31, the first address storage element 5110 of the first storage unit 5100 of the SCRS 5000 may be provided to store a column address information of a main column in the first sub-array 210 repaired in units of columns using the first spare column SC0 in the first spare column region 232. That a column address of '0' is stored in the first address storage element 5110 of the first storage unit 5100 of the SCRS 5000 may mean that all the main unit cells in the first main column (having a column address of '0') of the first sub-array 210 are replaced by all the spare unit cells in the first spare column SC0 of the first sub-array 210. That is, the spare unit cells in the first spare column SC0 of the first spare column region 232 may have a row address of '000' and a column address of '0', a row address of '001' and a column address of '0', a row address of '010' and a column address of '0', and a row address of '011' and a column address of '0', respectively. Accordingly, if a read command for selectively reading out a datum stored in any one of the main unit cells designated by a column address of '0', for example, a read command for reading out a datum stored in the main unit cell selected by a row address of '010' and a column address of '0' is generated, a datum stored in the spare unit cell having a row address of '010' among the spare unit cells in the first spare column SC0 of the first spare column region 232 (instead of a datum stored in the main unit cell disposed at a position denoted by a row address of '010' and a column address of '0') may be read out based on the column address information of '0' stored in the first address storage element 5110 of the first storage unit 5100 of the SCRS 5000.

The first address storage element 5210 of the second storage unit 5200 of the SCRS 5000 may be provided to store a column address information of a main column in the second sub-array 220 repaired in units of columns using the first spare column SC0 in the second spare column region 242. That a column address of '1' is stored in the first address storage element 5210 of the second storage unit 5200 of the SCRS 5000 may mean that all the main unit cells in the second main column (having a column address of '1') of the second sub-array 220 are replaced by all the spare unit cells in the first spare column SC0 of the second sub-array 220. That is, the spare unit cells in the first spare column SC0 of the second spare column region 242 may have a row address of '100' and a column address of '1', a row address of '101' and a column address of '1', a row address of '110' and a column address of '1', and a row address of '111' and a column address of '1', respectively. Accordingly, if a read command for selectively reading out a datum stored in any one of the main unit cells designated by a column address of '1', for example, a read command for reading out a datum stored in the main unit cell selected by a row address of '110' and a column address of '1' is generated, a datum stored in the spare unit cell having a row address of '110' among the spare unit cells in the first spare column SC0 of the second spare column region 242 (instead of a datum stored in the main unit cell disposed at a position denoted by a row address of '110' and a column address of '1') may be read out based on the column address information of '1' stored in the first address storage element 5210 of the second storage unit 5200 of the SCRS 5000.

The second address storage element 5120 of the first storage unit 5100 of the SCRS 5000 and the second address storage element 5220 of the second storage unit 5200 of the SCRS 5000 may be provided to store column address information of main columns in the sub-arrays 210 and 220 repaired in units of row groups using the second spare columns SC1 in the first and second spare column regions 232 and 242. For example, the second address storage element 5120 of the first storage unit 5100 of the SCRS 5000 may be provided to store column address information of a main column repaired using the spare unit cells belonging to the first row group in the second spare columns SC1 of the first and second spare column regions 232 and 242, and the second address storage element 5220 of the second storage unit 5200 of the SCRS 5000 may be provided to store column address information of a main column repaired using the spare unit cells belonging to the second row group in the second spare columns SC1 of the first and second spare column regions 232 and 242.

Specifically, that a column address of '(n−1)' is stored in the second address storage element 5120 of the first storage unit 5100 of the SCRS 5000 may mean that the main unit cells belonging to the first row group (i.e., the main unit cells in the first row and the third row of the $N^{th}$ main column) among the main unit cells in the $N^{th}$ main column (having a column address of '(n−1)') of the first and second sub-arrays 210 and 220 are replaced by the spare unit cells belonging to the first row groups in the second spare columns SC1 of the first and second spare column regions 232 and 242. Thus, the spare unit cells belonging to the first row group in the second spare column SC1 of the first spare column region 232 may have a row address of '000' and a column address of '(n−1)' as well as a row address of '010' and a column address of '(n−1)', respectively. Similarly, the spare unit cells belonging to the first row group in the second spare column SC1 of the second spare column region 242 may have a row address of '100' and a column address of '(n−1)' as well as a row address of '110' and a column address of '(n−1)', respectively.

Accordingly, if a read command for selectively reading out a datum stored in any one of the main unit cells belonging to the first row group designated by a column address of '(n−1)' in the first sub-array 210, for example, a read command for reading out a datum stored in the main unit cell selected by a row address of '010' and a column address of '(n−1)' is generated, a datum stored in the spare unit cell having a row address of '010' among the spare unit cells in the second spare column SC1 of the first spare column region 232 (instead of a datum stored in the main unit cell disposed at a position denoted by a row address of '010' and a column address of '(n−1)') may be read out based on the column address information of '(n−1)' stored in the second address storage element 5120 of the first storage unit 5100 of the SCRS 5000. In addition, if a read command for selectively reading out a datum stored in any one of the main unit cells belonging to the first row group designated by a column address of '(n−1)' in the second sub-array 220, for example, a read command for reading out a datum stored in the main unit cell selected by a row address of '110' and a column address of '(n−1)' is generated, a datum stored in the spare unit cell having a row address of '110' among the spare unit cells in the second spare column SC1 of the second spare column region 242 (instead of a datum stored in the main unit cell disposed at a position denoted by a row address of '110' and a column address of '(n−1)') may be read out based on the column address information of '(n−1)' stored in the second address storage element 5120 of the first storage unit 5100 of the SCRS 5000.

Similarly, that a column address of '1' is stored in the second address storage element 5220 of the second storage unit 5200 of the SCRS 5000 may mean that the main unit cells belonging to the second row group (i.e., the main unit cells in the second row and the fourth row of the second main column) among the main unit cells in the second main column (having a column address of '1') of the first sub-array 210 are replaced by the spare unit cells belonging to the second row group in the second spare columns SC1 of the first spare column regions 232. That is, the spare unit cells belonging to the second row group in the second spare column SC1 of the first spare column region 232 may have a row address of '001' and a column address of '1' as well as a row address of '011' and a column address of '1', respectively. Similarly, the spare unit cells belonging to the second row group in the second spare column SC1 of the second spare column region 242 may have a row address of '101' and a column address of '(n–2)' as well as a row address of '111' and a column address of '(n–2)', respectively.

Accordingly, if a read command for selectively reading out a datum stored in any one of the main unit cells belonging to the second row group designated by a column address of '1' in the first sub-array 210, for example, a read command for reading out a datum stored in the fourth failed unit cell 2740 selected by a row address of '001' and a column address of '1' is generated, a datum stored in the spare unit cell having a row address of '001' among the spare unit cells in the second spare column SC1 of the first spare column region 232 (instead of a datum stored in the fourth failed unit cell 2740 selected by a row address of '001' and a column address of '1') may be read out based on the column address information of '(n–2)' stored in the second address storage element 5220 of the second storage unit 5200 of the SCRS 5000.

As described above, as a result of the hybrid column remapping process, the column address of '1' may be stored in both of the first and second address storage elements 5210 and 5220 of the second storage unit 5200 of the SCRS 5000. This is because the second main column (having a column address of '1') of the first sub-array 210 is repaired in units of row groups while the second main column (having a column address of '1') of the second sub-array 220 is repaired in units of columns, as described with reference to FIG. 30. In such a case, if a read command is generated to selectively output a datum stored in any one of the main unit cells in the second main column having a column address of '1', it may be impossible to discriminate whether the selected unit cell is repaired in units of columns or in units of row groups.

Accordingly, in illustrated in FIG. 31, if the same column address is stored in both of the first and second address storage elements 5210 and 5220 of the second storage unit 5200 of the SCRS 5000, the priority for selecting a main unit cell may be given to the main column which is repaired in units of columns and physically remapped. Thus, if a read command for the second main column having a column address of '1' in the second sub-array 220 is generated, a read operation of the first spare column SC0 in the second sub-array 220 (instead of the second main column in the second sub-array 220) may be performed according to the priority even though the same column address of ill is stored in both of the first and second address storage elements 5210 and 5220. In contrast, if a read command for reading out data stored in the main unit cells belonging to the second row group in the second main column having a column address of '1' in the first sub-array 210 is generated, a read operation of the spare unit cells belonging to the second row group in the second spare column SC1 of the first sub-array 210 may be performed according to the column address information stored in the second address storage element 5220 of the second storage unit 5200 of the SCRS 5000.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:
1. A memory device comprising:
a data storage region including a plurality of sub-arrays, each of which includes a plurality of main columns and a plurality of spare columns; and
a spare column remap storage including a plurality of storage units storing column address information of the main columns repaired using the plurality of spare columns,
wherein each of the plurality of storage units includes a plurality of address storage elements, and
wherein at least one of the plurality of storage units includes:
a first address storage element configured to store column address information of one main column selected from the main columns in one sub-array selected from the plurality of sub-arrays, which is repaired in units of columns using one spare column selected from the spare columns in the selected sub-array; and
a second address storage element configured to store column address information of another main column of the main columns in the selected sub-array, which is repaired in units of row groups using another spare column of the spare columns in the selected sub-array,
wherein all main unit cells in the selected main column repaired in units of columns are replaced by all spare unit cells in the selected spare column, respectively; and
wherein main unit cells belonging to a selected row group among main unit cells in the other main column repaired in units of row groups are replaced by spare unit cells belonging to the selected row group among spare unit cells in the other spare column, respectively.

2. The memory device of claim 1, wherein each of the plurality of sub-arrays includes main unit cells which are respectively located at cross points of a plurality of rows and the plurality of main columns and spare unit cells which are respectively located at cross points of the plurality of rows and the plurality of spare columns.

3. The memory device of claim 2,
wherein the number of the main columns included in each of the plurality of sub-arrays is 'N' (where, 'N' denotes a natural number); and
wherein the number of the spare columns included in each of the plurality of sub-arrays is 'M' (where, 'M' denotes a natural number).

4. The memory device of claim 1, wherein the number of the address storage elements included in each of the plurality of storage units is equal to the number of the spare columns included in each of the plurality of sub-arrays.

5. The memory device of claim 1,
wherein the selected main column repaired in units of columns includes failed unit cells, the number of which is greater than or equal to a critical value; and
wherein the other main column repaired in units of row groups includes failed unit cells, the number of which is less than the critical value.

6. The memory device of claim 5, wherein if the number of rows in each sub-array is "L" and the number of spare columns in each sub-array is "S", the critical value is set as a natural number which is greater than "L÷S".

7. The memory device of claim 1,
wherein the plurality of sub-arrays are comprised of a first sub-array and a second sub-array; and
wherein each of the first sub-array and the second sub-array includes a first row group and a second row group.

8. The memory device of claim 7,
wherein the first row group includes odd-numbered rows among a plurality of rows in the first sub-array and odd-numbered rows among a plurality of rows in the second sub-array; and
wherein the second row group includes even-numbered rows among the plurality of rows in the first sub-array and odd-numbered rows among the plurality of rows in the second sub-array.

9. The memory device of claim 7, wherein a logic level of least significant bits (LSBs) of binary row addresses of main unit cells and spare unit cells belonging to the first row group is different from a logic level of least significant bits (LSBs) of binary row addresses of main unit cells and spare unit cells belonging to the second row group.

10. The memory device of claim 9, wherein a logic level of most significant bits (MSBs) of binary row addresses of main unit cells and spare unit cells belonging to the first sub-array is different from a logic level of most significant bits (MSBs) of binary row addresses of main unit cells and spare unit cells belonging to the second sub-array.

11. The memory device of claim 7,
wherein the main column having failed unit cells, the number of which is greater than or equal to a critical value, among the plurality of main columns in each of the first and second sub-arrays is repaired in units of columns; and
wherein the main column having failed unit cells, the number of which is less than the critical value, among the plurality of main columns in each of the first and second sub-arrays is repaired in units of row groups.

12. The memory device of claim 11,
wherein the plurality of spare columns included in each of the first and second sub-arrays are comprised of a first spare column and a second spare column;
wherein all main unit cells in the main column repaired in units of columns in the first sub-array are replaced by all spare unit cells in the first spare column of the first sub-array, respectively; and
wherein all main unit cells in the main column repaired in units of columns in the second sub-array are replaced by all spare unit cells in the first spare column of the second sub-array, respectively.

13. The memory device of claim 12,
wherein main unit cells belonging to the first row group among a plurality of main unit cells in the main columns repaired in units of row groups in the first and second sub-arrays are replaced by spare unit cells belonging to the first row group among a plurality of spare unit cells in the second spare columns of the first and second sub-arrays, respectively; and
wherein main unit cells belonging to the second row group among the plurality of main unit cells in the main columns repaired in units of row groups in the first and second sub-arrays are replaced by spare unit cells belonging to the second row group among the plurality of spare unit cells in the second spare columns of the first and second sub-arrays, respectively.

14. The memory device of claim 13,
wherein the plurality of storage units are comprised of a first storage unit and a second storage unit;
wherein each of the first and second storage units includes the first address storage element and the second address storage element;
wherein the first address storage element of the first storage unit is provided to store column address information of a first main column repaired in units of columns among the main columns of the first sub-array;
wherein the second address storage element of the first storage unit is provided to store column address information of a second main column including a failed unit cell belonging to the first row group among the main columns of the first sub-array;
wherein the first address storage element of the second storage unit is provided to store column address information of a third main column repaired in units of columns among the main columns of the second sub-array; and
wherein the second address storage element of the second storage unit is provided to store column address information of a fourth main column including a failed unit cell belonging to the second row group among the main columns of the first sub-array.

15. The memory device of claim 14, wherein if the column address information stored in the first address storage element of the second storage unit is identical to the column address information stored in the second address storage element of the second storage unit, the main column in the second sub-array corresponding to the column address information stored in both of the first and second storage elements of the second storage unit is regarded as being repaired in units of columns.

16. A method of remapping addresses in a memory device including a data storage region and a spare column remap storage, wherein the data storage region includes a plurality of sub-arrays, wherein each of the plurality of sub-arrays includes a plurality of main columns and a plurality of spare columns, and wherein the spare column remap storage includes a plurality of storage units, the method comprising:
storing address information of a repaired main column of one of the plurality of sub-arrays and address information of a repaired main column of another of the plurality of sub-arrays into at least one of the plurality of storage units included in the spare column remap storage,
wherein the plurality of sub-arrays are comprised of a first sub-array and a second sub-array;
wherein the plurality of storage units are comprised of a first storage unit and a second storage unit;
wherein storing the address information of the repaired main column of one of the plurality of sub-arrays and the address information of the repaired main column of another of the plurality of sub-arrays into the at least one of the plurality of storage units includes:
classifying a plurality of rows in each of the first and second sub-arrays as a first row group or a second row group; and
storing column address information of the main columns including failed unit cells belonging to the first row groups into the first storage unit, and
wherein the method further comprises storing column address information of the main columns including failed unit cells belonging to the second row groups into the second storage unit.

17. The method of claim 16, wherein classifying the plurality of rows in each of the first and second sub-arrays as the first row group or the second row group is performed so that the number of failed unit cells belonging to the first row groups in the first and second sub-arrays is less than or equal to the number of spare columns in the first or second sub-array and the number of failed unit cells belonging to the second row groups in the first and second sub-arrays is less than or equal to the number of spare columns in the first or second sub-array.

18. The method of claim 16, wherein classifying the plurality of rows in each of the first and second sub-arrays as the first row group or the second row group is performed so that the first row group includes odd-numbered rows among the plurality of rows in the first and second sub-arrays and the second row group includes even-numbered rows among the plurality of rows in the first and second sub-arrays.

19. The method of claim 16, wherein classifying the plurality of rows in each of the first and second sub-arrays as the first row group or the second row group is performed so that a logic level of most significant bits (MSBs) of binary row addresses of unit cells belonging to the first and second row groups of the first sub-array is different from a logic level of most significant bits (MSBs) of binary row addresses of unit cells belonging to the first and second row groups of the second sub-array.

20. The method of claim 16, wherein classifying the plurality of rows in each of the first and second sub-arrays as the first row group or the second row group is performed so that a logic level of least significant bits (LSBs) of binary row addresses of unit cells belonging to the first row groups in the first and second sub-arrays is different from a logic level of least significant bits (LSBs) of binary row addresses of unit cells belonging to the second row groups in the first and second sub-arrays.

21. The method of claim 16,
wherein each of the first and second storage units includes a first virtual address storage element and a second virtual address storage element;
wherein the plurality of spare columns in each of the first and second sub-arrays are comprised of a first spare column and a second spare column; and
wherein storing the column address information of the main columns including the failed unit cells belonging to the first row groups into the first storage unit and storing the column address information of the main columns including the failed unit cells belonging to the second row groups into the second storage unit includes:
storing column address information of the main columns repaired using the first spare columns of the first and second sub-arrays into the first virtual address storage elements of the first and second storage units; and
storing column address information of the main columns repaired using the second spare columns of the first and second sub-arrays into the second virtual address storage elements of the first and second storage units.

22. A method of remapping addresses in a memory device including a data storage region and a spare column remap storage, wherein the data storage region includes a plurality of sub-arrays, wherein each of the plurality of sub-arrays includes a plurality of main columns and a plurality of spare columns, and wherein the spare column remap storage includes a plurality of storage units, the method comprising:
storing column address information of one main column repaired in units of columns among the plurality of main columns and column address information of another main column repaired in units of row groups among the plurality of main columns into at least one of the plurality of storage units,
wherein the plurality of sub-arrays are comprised of a first sub-array and a second sub-array;
wherein the plurality of spare columns included in each of the first and second sub-arrays are comprised of a first spare column and a second spare column; and
wherein the method further comprises:
classifying rows in each of the first and second sub-arrays as a first row group or a second row group;
replacing all main unit cells in a first main column including failed unit cells, the number of which is greater than or equal to a critical value, among the main columns of the first sub-array with all spare unit cells in the first spare column of the first sub-array to perform a first repair process in units of columns;
replacing all main unit cells in a second main column including failed unit cells, the number of which is greater than or equal to the critical value, among the main columns of the second sub-array with all spare unit cells in the first spare column of the second sub-array to perform a second repair process in units of columns;
replacing main unit cells and failed unit cells belonging to the first row group in a third main column including the failed unit cells, the number of which is less than the critical value, among the main columns of the first sub-array with spare unit cells belonging to the first row group in the second spare column of the first sub-array to perform a third repair process in units of row groups; and
replacing main unit cells and failed unit cells belonging to the second row group in a fourth main column including the failed unit cells, the number of which is less than the critical value, among the main columns of the first sub-array with spare unit cells belonging to the second row group in the second spare column of the first sub-array to perform a fourth repair process in units of row groups.

23. The method of claim 22,
wherein the plurality of storage units are comprised of a first storage unit and a second storage unit;
wherein each of the first and second storage units includes a first address storage element and a second address storage element;
wherein storing the column address information of the one main column repaired in units of columns into at least one of the first and second storage units includes:
storing the column address information of the first main column into the first address storage element of the first storage unit; and
storing the column address information of the second main column into the first address storage element of the second storage unit, and
wherein storing the column address information of the other main column repaired in units of row groups into at least one of the first and second storage units includes:
storing the column address information of the third main column into the second address storage element of the first storage unit; and
storing the column address information of the fourth main column into the second address storage element of the second storage unit.

24. The method of claim 23, wherein if the column address information stored in the first address storage element of the second storage unit is identical to the column address information stored in the second address storage element of the second storage unit, the main column in the second sub-array corresponding to the column address information stored in both the first and second storage elements of the second storage unit is regarded as being repaired in units of columns.

25. The method of claim 22, wherein classifying the rows in each of the first and second sub-arrays as the first row group or the second row group includes:
defining odd-numbered rows among a plurality of rows in each of the first and second sub-arrays as the first row group; and
defining even-numbered rows among the plurality of rows in each of the first and second sub-arrays as the second row group.

\* \* \* \* \*